US010025186B2

(12) United States Patent
Goto et al.

(10) Patent No.: US 10,025,186 B2
(45) Date of Patent: Jul. 17, 2018

(54) ACTIVE-LIGHT-SENSITIVE OR RADIATION-SENSITIVE RESIN COMPOSITION, PATTERN FORMING METHOD, AND METHOD FOR MANUFACTURING ELECTRONIC DEVICE

(71) Applicant: FUJIFILM Corporation, Tokyo (JP)

(72) Inventors: Akiyoshi Goto, Haibara-gun (JP); Masafumi Kojima, Haibara-gun (JP); Keita Kato, Haibara-gun (JP); Keiyu Ou, Haibara-gun (JP); Michihiro Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/444,471

(22) Filed: Feb. 28, 2017

(65) Prior Publication Data
US 2017/0168394 A1 Jun. 15, 2017

Related U.S. Application Data

(63) Continuation of application No. PCT/JP2015/073605, filed on Aug. 21, 2015.

(30) Foreign Application Priority Data

Sep. 3, 2014 (JP) ................. 2014-179501

(51) Int. Cl.
*G03F 7/004* (2006.01)
*G03F 7/038* (2006.01)
*G03F 7/16* (2006.01)
*G03F 7/38* (2006.01)
*G03F 7/32* (2006.01)
*G03F 7/40* (2006.01)
*G03F 7/20* (2006.01)
*C08F 220/28* (2006.01)
*C08F 220/18* (2006.01)
*C08F 220/36* (2006.01)
*C08F 220/26* (2006.01)
*G03F 7/039* (2006.01)
*H01L 21/027* (2006.01)

(52) U.S. Cl.
CPC ............ *G03F 7/038* (2013.01); *C08F 220/18* (2013.01); *C08F 220/26* (2013.01); *C08F 220/28* (2013.01); *C08F 220/36* (2013.01); *G03F 7/004* (2013.01); *G03F 7/0045* (2013.01); *G03F 7/0397* (2013.01); *G03F 7/16* (2013.01); *G03F 7/168* (2013.01); *G03F 7/2041* (2013.01); *G03F 7/32* (2013.01); *G03F 7/327* (2013.01); *G03F 7/38* (2013.01); *G03F 7/40* (2013.01); *H01L 21/0274* (2013.01); *C08F 2220/282* (2013.01); *C08F 2220/283* (2013.01); *C08F 2220/365* (2013.01)

(58) Field of Classification Search
CPC .......... G03F 7/004; G03F 7/32; G03F 7/0397; C08F 220/18; C08F 220/26; H01L 21/0274
USPC ............ 430/270.1, 322, 325, 329, 330, 331; 526/280, 308, 319
See application file for complete search history.

(56) References Cited

U.S. PATENT DOCUMENTS

| | | | |
|---|---|---|---|
| 2012/0135350 A1 | 5/2012 | Kobayashi et al. | |
| 2012/0264052 A1* | 10/2012 | Irie | C08F 224/00 430/270.1 |
| 2013/0137048 A1 | 5/2013 | Yahagi et al. | |
| 2013/0209935 A1 | 8/2013 | Sagehashi et al. | |
| 2013/0236832 A1* | 9/2013 | Ohashi | G03F 7/004 430/285.1 |
| 2013/0344442 A1* | 12/2013 | Sagehashi | G03F 7/004 430/285.1 |
| 2014/0051026 A1 | 2/2014 | Hasegawa et al. | |
| 2014/0212808 A1 | 7/2014 | Funatsu et al. | |
| 2014/0234785 A1* | 8/2014 | Hatakeyama | G03F 7/40 430/326 |
| 2014/0242519 A1* | 8/2014 | Sagehashi | G03F 7/038 430/285.1 |
| 2014/0255843 A1 | 9/2014 | Kobayashi et al. | |

FOREIGN PATENT DOCUMENTS

| | | |
|---|---|---|
| JP | 2012-113143 A | 6/2012 |
| JP | 2013-097272 A | 5/2013 |
| JP | 2013-163652 A | 8/2013 |
| JP | 2014-038257 A | 2/2014 |
| JP | 2014-145809 A | 8/2014 |
| JP | 2014-170167 A | 9/2014 |
| KR | 10-2014-0097006 A | 8/2014 |

OTHER PUBLICATIONS

International Search Report of PCT/JP2015/073605 dated Oct. 6, 2015 [PCT/ISA/210].

(Continued)

*Primary Examiner* — Amanda C Walke
(74) *Attorney, Agent, or Firm* — Sughrue Mion, PLLC

(57) ABSTRACT

The present invention has an object to provide an active-light-sensitive or radiation-sensitive resin composition having high DOF and low LWR; a pattern forming method using the composition; and a method for manufacturing an electronic device. The active-light-sensitive or radiation-sensitive resin composition of the present invention includes a resin P and a compound that generates an acid upon irradiation with active light or radiation, in which the resin P has a repeating unit p1 and a repeating unit p2 represented by specific formulae, and the repeating unit p2 does not have a group in which a hydroxy group of a hydroxyadamantyl group is protected with a group that decomposes by the action of an acid to leave.

12 Claims, No Drawings

(56) References Cited

OTHER PUBLICATIONS

Written Opinion of PCT/JP2015/073605 dated Oct. 6, 2015 [PCT/ISA/237].
International Preliminary Report on Patentability dated Mar. 16, 2017 issued by the International Bureau in PCT/JP2015/073605 with translation of Written opinion.
Communication dated Dec. 12, 2017, from the Japanese Patent Office in counterpart application No. 2016-546423.
Office Action dated Jan. 27, 2018 from the Korean Intellectual Property Office in counterpart Korean Application No. 10-2017-7004169.

* cited by examiner

ACTIVE-LIGHT-SENSITIVE OR RADIATION-SENSITIVE RESIN COMPOSITION, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2015/073605 filed on Aug. 21, 2015, which claims priority under 35 U.S.C. § 119(a) to Japanese Patent Application No. 2014-179501 filed on Sep. 3, 2014. The above application is hereby expressly incorporated by reference, in its entirety, into the present application.

BACKGROUND OF THE INVENTION

1. Field of the Invention

The present invention relates to an active-light-sensitive or radiation-sensitive resin composition, a pattern forming method, and a method for manufacturing an electronic device. More specifically, the present invention relates to a pattern forming method which is suitable for a process for manufacturing a semiconductor such as an IC, a process for manufacturing a circuit board for a liquid crystal, a thermal head, or the like, and other lithographic processes for photofabrication; and an active-light-sensitive or radiation-sensitive resin composition (resist composition) used therefor. The present invention further relates to a method for manufacturing an electronic device, including the pattern forming method.

2. Description of the Related Art

In the related art, in processes for manufacturing semiconductor devices such as an IC or a LSI, fine processing by lithography using a resist composition has been carried out.

JP2013-163652A discloses "a resist material including a base resin which has a polymer compound containing a predetermined repeating unit; an acid generator; and an organic solvent" as the resist composition (Claims 2 and 4, and Examples).

SUMMARY OF THE INVENTION

In recent years, high levels of functions have been required for various types of electronic equipment, and correspondingly, additional improvement of characteristics of resist compositions for use in fine processing is required. In particular, additional improvement of depth of focus (DOF) and line width roughness (LWR) is required. Specifically, a resist composition having high DOF and low LWR is required.

Under this circumstance, the present inventors have investigated the resist compositions described in Examples of JP2013-163652A, and thus, it has been found that the DOF and the LWR may not meet the recently required levels in some cases.

Taking into consideration the above circumstances, the present invention has an object to provide an active-light-sensitive or radiation-sensitive resin composition having high DOF and low LWR, a pattern forming method using the composition, and a method for manufacturing an electronic device.

The present inventors have conducted extensive studies on the above tasks, and as a result, they have found that the tasks can be accomplished by using a resin having a specific repeating unit.

That is, the present inventors have found that the tasks can be accomplished by the following configurations.

(1) An active-light-sensitive or radiation-sensitive resin composition comprising: a resin P; and a compound that generates an acid upon irradiation with active light or radiation, in which the resin P includes a repeating unit p1 represented by the following General Formula (1) and a repeating unit p2 represented by the following General Formula (2), and the repeating unit p2 does not have a group in which a hydroxy group of a hydroxyadamantyl group is protected with a group that decomposes by the action of an acid to leave.

(2) The active-light-sensitive or radiation-sensitive resin composition as described in (1), in which, in General Formula (2), the total number of carbon atoms of $Rx_1$ to $Rx_3$ is 10 or less.

(3) The active-light-sensitive or radiation-sensitive resin composition as described in (1) or (2), in which the repeating unit p2 is a repeating unit p21 represented by the following General Formula (2-1).

(4) The active-light-sensitive or radiation-sensitive resin composition as described in (1) or (2), in which the repeating unit p2 is a repeating unit p22 represented by the following General Formula (2-2).

(5) The active-light-sensitive or radiation-sensitive resin composition as described in (4), in which, in General Formula (2-2), at least one of $R_{32}$, $R_{33}$, or $R_{34}$ is a linear or branched alkyl group having 2 or more carbon atoms.

(6) The active-light-sensitive or radiation-sensitive resin composition as described in (4), in which, in General Formula (2-2), at least two of $R_{32}$, $R_{33}$, or $R_{34}$ are a linear or branched alkyl group having 2 or more carbon atoms.

(7) The active-light-sensitive or radiation-sensitive resin composition as described in (4), in which, in General Formula (2-2), all of $R_{32}$, $R_{33}$, and $R_{34}$ are a linear or branched alkyl group having 2 or more carbon atoms.

(8) A pattern forming method comprising at least (i) a step of forming an active-light-sensitive or radiation-sensitive resin composition film on a substrate, using the active-light-sensitive or radiation-sensitive resin composition as described in any one of (1) to (7); (ii) a step of irradiating the film with active light or radiation; and (iii) a step of developing the film irradiated with active light or radiation using a developer.

(9) The pattern forming method as described in (8), in which the developer is a developer including an organic solvent.

(10) A method for manufacturing an electronic device, comprising the pattern forming method as described in (8) or (9).

As shown below, according to the present invention, it is possible to provide an active-light-sensitive or radiation-sensitive resin composition having high DOF and low LWR, a pattern forming method using the composition, and a method for manufacturing an electronic device.

DESCRIPTION OF THE PREFERRED EMBODIMENTS

Hereinafter, suitable aspects of the present invention will be described in detail.

In citations for a group and an atomic group in the present specification, in a case where the group is denoted without specifying whether it is substituted or unsubstituted, the group includes both a group and an atomic group not having a substituent, and a group and an atomic group having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

In the present invention, "active light" or "radiation" means, for example, a bright line spectrum of a mercury lamp, far ultraviolet rays represented by an excimer laser, extreme ultraviolet rays (EUV light), X-rays, particle rays such as electron beams and ion beams, or the like. In addition, in the present invention, "light" means active light or radiation.

Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

In the present specification, "(meth)acrylate" represents "at least one of acrylate or methacrylate". In addition, "(meth)acrylic acid" represents "at least one of acrylic acid or methacrylic acid.

In the present specification, "(a value) to (a value)" means a range including the numerical values described before and after "to" as a lower limit value and an upper limit value, respectively.

The active-light-sensitive or radiation-sensitive resin composition of the present invention (hereinafter also referred to as "the composition of the present invention" or "the resist composition of the present invention) contains a resin P and a compound that generates an acid upon irradiation with active light or radiation.

Here, the resin P includes a repeating unit p1 represented by the following General Formula (1) and a repeating unit p2 represented by the following General Formula (2), and the repeating unit p2 does not have a group in which a hydroxy group of a hydroxyadamantyl group is protected with a group that decomposes by the action of an acid to leave.

Hereinafter, the composition of the present invention will be described.

The composition of the present invention may be used in negative type development (development in which an exposed area remains as a pattern and an unexposed area is removed), or may also be used in positive type development (development in which an exposed area is removed, and an unexposed area remains as a pattern). That is, development may also be carried out using any one of a developer including an organic solvent and an alkali developer.

Furthermore, the composition of the present invention is typically a chemical amplification type resist composition. First, the respective components contained in the composition of the present invention will be described, and then a pattern forming method using the composition of the present invention will be described in detail.

[1] Resin P

The resin P includes a repeating unit p1 represented by the following General Formula (1) and a repeating unit p2 represented by the following General Formula (2).

[1-1] Repeating Unit p1

The repeating unit p1 is a repeating unit represented by the following General Formula (1), and usually decomposes by the action of an acid and has a covalent bond between an oxygen atom and a quaternary carbon atom cleaved to generate a carboxyl group.

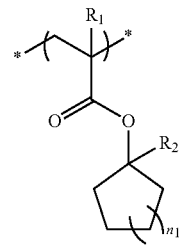

(1)

In General Formula (1), $R_1$ represents a hydrogen atom or an organic group, $R_2$ represents a tertiary alkyl group, $n_1$ represents a positive integer, and * represents a binding position.

Examples of the organic group represented by $R_1$ in General Formula (1) include an alkyl group which may have a substituent such as a fluorine atom and a hydroxyl group, and as $R_1$, a hydrogen atom, a methyl group, a trifluoromethyl group, or a hydroxymethyl group is preferable.

Examples of the tertiary alkyl group represented by $R_2$ in General Formula (1) include a tert-butyl group, a tert-amyl group, a triethylcarbyl group, a 1-ethylnorbornyl group, a 1-methylcyclohexyl group, a 1-ethylcyclopentyl group, a 2-(2-methyl)adamantyl group, and a 2-(2-ethyl)adamantyl group, among which a tert-butyl group and a tert-amyl group are preferable.

Examples of the positive integer represented by $n_1$ in General Formula (1) include an integer of 1 to 8, and the positive integer is preferably an integer of 1 to 4, and more preferably an integer of 1 to 3.

In addition, in the monocyclic cycloalkyl group in General Formula (1), a hydrogen atom which can be substituted may be substituted with a substituent.

Specific examples of the repeating unit p1 represented by General Formula (1) are shown below (in the following formulae, * representing a binding position is omitted). However, the present invention is not limited thereto.

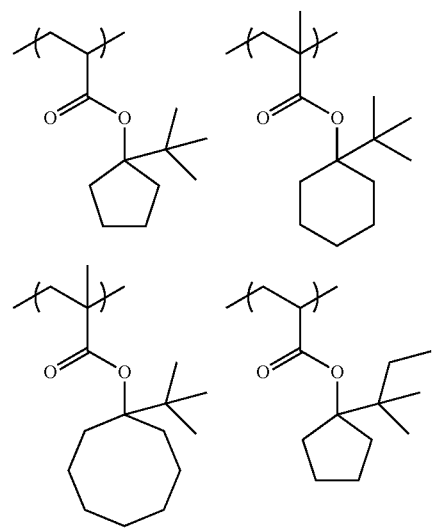

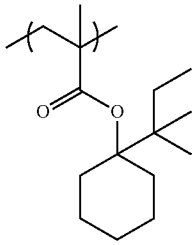

The repeating unit p1 represented by General Formula (1) contained in the resin P may be used singly or in combination of two or more kinds thereof.

The content of the repeating units p1 represented by General Formula (1) with respect to all the repeating units of the resin P is not particularly limited, and is preferably 10% to 70% by mole, more preferably 20% to 65% by mole, still more preferably 30% to 65% by mole, and particularly preferably 35% to 60% by mole.

[1-2] Repeating Unit p2

The repeating unit p2 is a repeating unit represented by the following General Formula (2), and usually decomposes by the action of an acid and has a covalent bond between an oxygen atom and a quaternary carbon atom cleaved to generate a carboxyl group.

Furthermore, the repeating unit p2 is a repeating unit other than the above-described repeating unit p1.

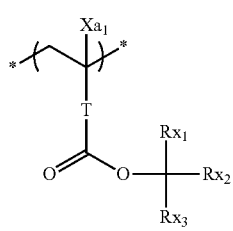

In General Formula (2), $Xa_1$ represents a hydrogen atom or an organic group. T represents a single bond or a divalent linking group. $Rx_1$ to $Rx_3$ each independently represent a linear or branched alkyl group or a monocyclic or polycyclic cycloalkyl group. Here, two members out of $Rx_1$ to $Rx_3$ may be bonded to each other to form a monocyclic or polycyclic cycloalkyl group. * represents a binding position.

Specific examples and suitable aspects of $Xa_1$ are the same as those of $R_1$ in General Formula (1).

Examples of the divalent linking group of T include an alkylene group, a —COO—Rt- group, and an —O—Rt- group. In the formulae, Rt represents an alkylene group or a cycloalkylene group.

T is preferably a single bond or a —COO—Rt- group. Rt is preferably an alkylene group having 1 to 5 carbon atoms, and more preferably a —CH$_2$— group, a —(CH$_2$)$_2$— group, or a —(CH$_2$)$_3$— group.

As the alkyl group of $Rx_1$ to $Rx_3$, alkyl groups having 1 to 4 carbon atoms, such as a methyl group, an ethyl group, an n-propyl group, an isopropyl group, an n-butyl group, an isobutyl group, and a t-butyl group are preferable.

As the cycloalkyl group of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable.

As the cycloalkyl group formed by the mutual bonding of two members out of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable, and monocyclic cycloalkyl groups having 5 or 6 carbon atoms are particularly preferable.

In the cycloalkyl group formed by the mutual bonding of two members out of $Rx_1$ to $Rx_3$, for example, one of the methylene groups constituting the ring may be substituted with a heteroatom such as an oxygen atom, or with a group having a heteroatom, such as a carbonyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The total number of carbon atoms of $Rx_1$ to $Rx_3$ is not particularly limited, and is preferably 10 or less and more preferably 3 to 8.

Suitable aspects of the repeating unit p2 include a repeating unit p21 represented by the following General Formula (2-1). In addition, the repeating unit p21 is an aspect in which two members out of $Rx_1$ to $Rx_3$ in General Formula (2) may be bonded to each other to form a monocyclic cycloalkyl group.

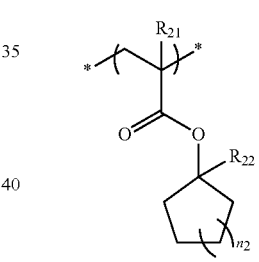

In General Formula (2-1), $R_{21}$ represents a hydrogen atom or an organic group. $R_{22}$ represents a primary alkyl group or a secondary alkyl group. $n_2$ represents a positive integer. * represents a binding position.

Specific examples and suitable aspects of $R_{21}$ are the same as those of $R_1$ in General Formula (1).

Examples of $R_{22}$ include a linear or branched alkyl group or a monocyclic or polycyclic cycloalkyl group (here, the groups are limited to a primary alkyl group or a secondary alkyl group). Specific examples of $R_{22}$ include those corresponding to a primary alkyl group or a secondary alkyl group, among the specific examples of $Rx_1$ to $Rx_3$ in General Formula (2).

Specific examples and suitable aspects of $n^2$ are the same as those of $n_1$ in General Formula (1).

Another suitable aspect of the repeating unit p2 includes a repeating unit p22 represented by the following General Formula (2-2). In addition, the repeating unit p22 is an aspect in which two members out of $Rx_1$ to $Rx_3$ in General Formula (2) are not bonded to each other.

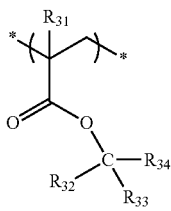

(2-2)

In General Formula (2-2), $R_{31}$ represents a hydrogen atom or an organic group. $R_{32}$, $R_{33}$, and $R_{34}$ each independently represent a linear or branched alkyl group. * represents a binding position.

Specific examples and suitable aspects of $R_31$ are the same as those of $R_1$ in General Formula (1).

Specific examples of $R_{32}$, $R_{33}$, and $R_{34}$ include those corresponding to a linear or branched alkyl group, among the specific examples of $Rx_1$ to $Rx_3$ in General Formula (2).

It is preferable that at least one of $R_{32}$, $R_{33}$, or $R_{34}$ is a linear or branched alkyl group having 2 or more carbon atoms, it is more preferable that at least two of $R_{32}$, $R_{33}$, or $R_{34}$ are a linear or branched alkyl group having 2 or more carbon atoms, and it is still more preferable that all of $R_{32}$, $R_{33}$, and $R_{34}$ are a linear or branched alkyl group having 2 or more carbon atoms.

Still another suitable aspect of the repeating unit p2 includes a repeating unit p23 represented by the following General Formula (2-3). In addition, the repeating unit p23 is an aspect in which two members out of $Rx_1$ to $Rx_3$ in General Formula (2) are not bonded to each other.

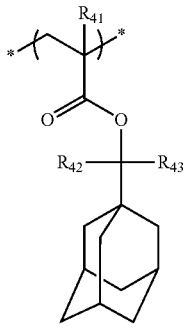

(2-3)

In General Formula (2-3), $R_{41}$ represents a hydrogen atom or an organic group. $R_{42}$ and $R_{43}$ each independently represent a linear or branched alkyl group. * represents a binding position.

Specific examples and suitable aspects of $R_{41}$ are the same as those of $R_1$ in General Formula (1).

Specific examples of $R_{42}$ and $R_{43}$ include those corresponding to a linear or branched alkyl group, among the specific examples of $Rx_1$ to $Rx_3$ in General Formula (2).

$R_{42}$ is preferably a linear alkyl group, more preferably a methyl group or an ethyl group, and still more preferably a methyl group.

$R_{43}$ is preferably a linear alkyl group, more preferably a methyl group or an ethyl group, and still more preferably an ethyl group.

An adamantyl group in General Formula (2-3) may have a substituent.

The repeating unit p2 does not have a group in which a hydroxy group of a hydroxyadamantyl group is protected with a group that decomposes by the action of an acid to leave.

The hydroxyadamantyl group is a group derived from an adamantyl group in which a hydrogen atom which can be substituted is substituted with a hydroxy group, and the number of the hydroxy groups contained in the hydroxyadamantyl group is not particularly limited. Specific examples of the hydroxyadamantyl group are shown below, but the present invention is not limited thereto. Here, * represents a binding position.

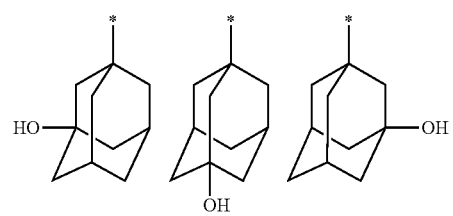

The hydroxyadamantyl group in which a hydroxy group is protected with a group that decomposes by the action of an acid to leave (hereinafter also referred to as a "protected hydroxyadamantyl group") is a group derived from a hydroxyadamantyl group in which a hydrogen atom of a hydroxy group (—OH) is substituted with a group that leaves by an acid. Here, examples of the group that leaves by an acid include —C($R_{36}$)($R_{37}$)($R_{38}$), —C($R_{36}$)($R_{37}$)($R_{39}$), and —C($R_{01}$)($R_{02}$)(O$R_{39}$).

In formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group. Specific examples of the protected hydroxyadamantyl group are shown below, but the present invention is not limited thereto. Here, * represents a binding position.

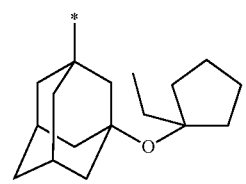 [SMILES: *C12CC3CC(C1)CC(OC1(CC)CCCC1)(C3)C2]

Since the repeating unit p2 does not have the protected hydroxyadamantyl group, electron density is not too high and an acid generated from a compound that generates an acid upon irradiation with active light or radiation (acid generator) is efficiently diffused. As a result, it is considered that DOF is high and LWR is low.

This is also predicted from the fact in which, in a case where the protected hydroxyadamantyl group is included (Comparative Examples 3 to 5), DOF is low and LWR is high, as shown in Comparative Examples which will be described later.

The repeating unit p2 represented by General Formula (2) contained in the resin P may be used singly or in combination of two or more kinds thereof.

The content of the repeating units p2 represented by General Formula (2) with respect to all the repeating units of the resin P is not particularly limited, and is preferably 5% to 50% by mole and more preferably 10% to 40% by mole.

[1-3] Repeating Unit (b)

The resin P preferably includes a repeating unit (b) having at least one of a lactone structure, a sultone (cyclic sulfonic ester) structure, or a carbonate structure, in addition to the above-mentioned repeating unit p1 and repeating unit p2. Here, the repeating unit (b) is preferably a repeating unit other than the above-mentioned repeating unit p1 and repeating unit p2.

The repeating unit (b) is not particularly limited as long as it is a repeating unit having the structure, but in view of obtaining more excellent effects of the present invention, a repeating unit derived from a (meth)acrylic acid derivative monomer is preferable.

Furthermore, the repeating unit (b) contained in the resin P may be used singly or in combination of two or more kinds thereof, but in view of obtaining more excellent effects of the present invention, one kind of the repeating unit (b) is preferably used. That is, the resin P preferably contains only one kind of the repeating unit (b) as the repeating unit (b).

The content of the repeating units (b) with respect to all the repeating units of the resin P varies depending on the structure that the repeating unit (b) has, but it may be, for example, 3% to 80% by mole, and is preferably 3% to 60% by mole.

Suitable aspects of the repeating unit (b) will be described below.

[1-3-1] Repeating Unit Having Lactone Structure or Sultone Structure

The lactone structure or the sultone structure is preferably a 5- to 7-membered ring lactone structure or a sultone structure, and is more preferably a 5- to 7-membered ring lactone structure or sultone structure to which another ring structure is fused so as to form a bicyclo structure or a spiro structure. The resin still more preferably has a repeating unit having a lactone structure or a sultone structure represented by any one of the following General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.

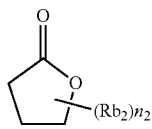

LC1-1

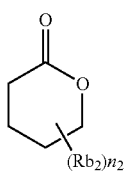

LC1-2

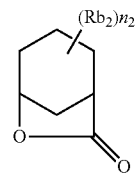

LC1-3

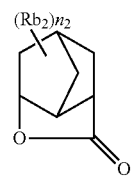

LC1-4

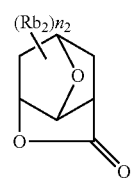

LC1-5

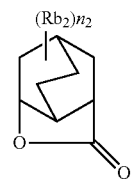

LC1-6

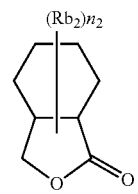

LC1-7

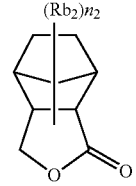

LC1-8

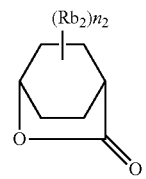

LC1-9

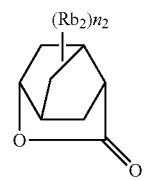

LC1-10

LC1-11
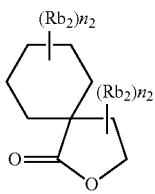

LC1-12
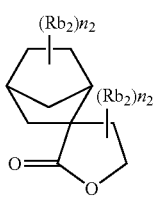

LC1-13
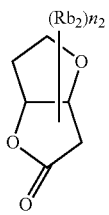

LC1-14
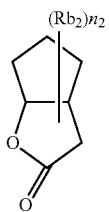

LC1-15
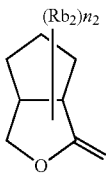

LC1-16
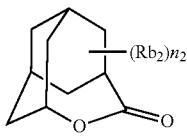

LC1-17
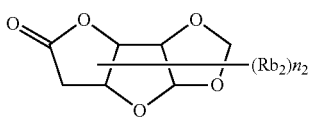

SL1-1
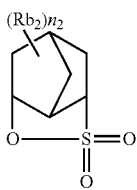

SL1-2
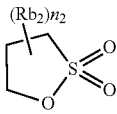

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. When $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin P contains a repeating unit having a lactone structure or a sultone structure, represented by the following General Formula (III).

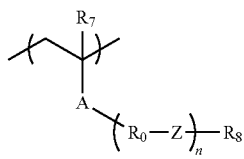
(III)

In Formula (III),

A represents an ester bond (a group represented by —COO—) or an amide bond (a group represented by —CONH—).

In a case where $R_0$'s are present in plural numbers, they each independently represent an alkylene group, a cycloalkylene group, or a combination thereof.

In a case where Z's are present in plural numbers, they each independently represent a single bond, an ether bond, an ester bond, an amide bond, a urethane bond (a group represented by

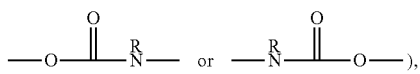

or an urea bond
(a group represented by

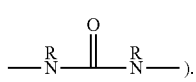

Here, R's each independently represent a hydrogen atom, an alkyl group, a cycloalkyl group, or an aryl group.

$R_8$ represents a monovalent organic group having a lactone structure or a sultone structure.

n is the repetition number of the structure represented by —$R_0$—Z—, and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include halogen atoms such as a fluorine atom, a chlorine atom, and a bromine atom; a mercapto group; a hydroxy group; alkoxy groups such as a methoxy group, an ethoxy group, an isopropoxy group, a t-butoxy group, and a benzyloxy group; and acetoxy groups such as an acetyloxy group and a propionyloxy group. $R_7$ is preferably a hydrogen atom, a methyl group, a trifluoromethyl group, or a hydroxymethyl group.

The preferred chain alkylene group in $R_0$ is chain alkylene group, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chain alkylene group is more preferable, and a methylene group is particularly preferable.

The monovalent organic group having a lactone structure or sultone structure represented by $R_8$ is not limited as long as it has the lactone structure or sultone structure, specific examples thereof include the above-mentioned lactone structures or sultone structures represented by General Formula (LC1-1) to (LC1-17), (SL1-1), and (SL1-2), and among these, the structure represented by (LC1-4) is particularly preferable. Further, $n_2$ in (LC1-1) to (LC1-17), (SL1-1), and (SL1-2) is more preferably 2 or less.

Furthermore, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 0.

Specific examples of the repeating unit having a group having a lactone structure or a sultone structure, represented by General Formula (III), are shown below, but the present invention is not limited thereto.

In the following specific examples, R represents a hydrogen atom, an alkyl group which may have a substituent, or a halogen atom, and preferably a hydrogen atom, a methyl group, a hydroxymethyl group, or an acetoxymethyl group.

In the following Formulae, Me represents a methyl group.

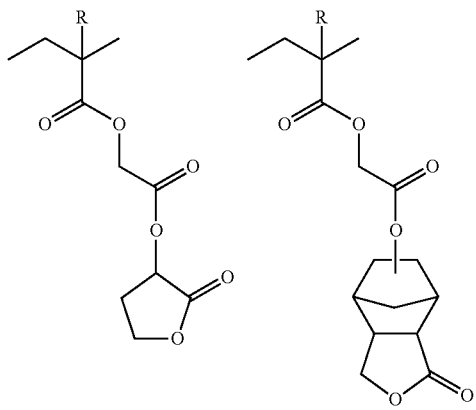

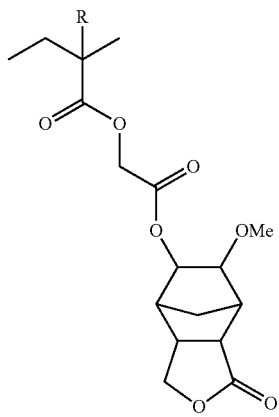

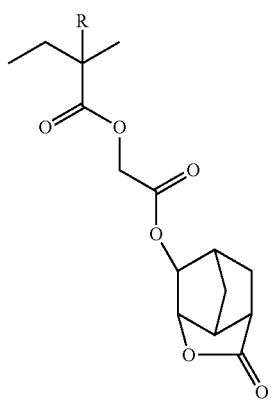

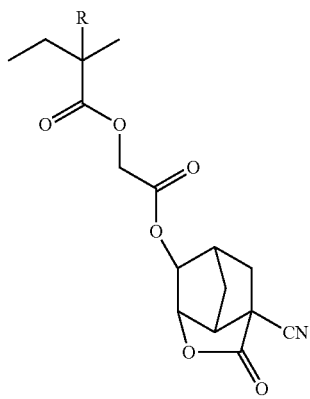

As the repeating unit having a lactone structure or a sultone structure, a repeating unit represented by the following General Formula (III-1) or (III-1') is more preferable.

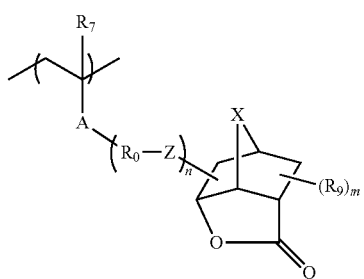

(III-1)

-continued (III-1')

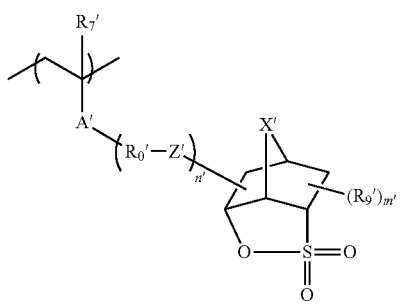

In General Formulae (III-1) and (III-1'), $R_7$, A, $R_0$, Z, and n have the same definitions as in General Formula (III).

$R_7'$, A', $R_0'$, Z', and n' each have the same definitions as $R_7$, A, $R_0$, Z, and n, respectively, in General Formula (III).

In a case where $R_9$ are in plural numbers, they each independently represent an alkyl group, a cycloalkyl group, an alkoxycarbonyl group, a cyano group, a hydroxyl group, or an alkoxy group, and in a case where they are in plural numbers, two $R_9$'s may be bonded to each other to form a ring.

In a case where $R_9''$s are in plural numbers, they each independently represent an alkyl group, a cycloalkyl group, an alkoxycarbonyl group, a cyano group, a hydroxyl group, or an alkoxy group, and in a case where they are in plural numbers, two $R_9''$s may be bonded to each other to form a ring.

X and X' each independently represent an alkylene group, an oxygen atom, or a sulfur atom.

m and m' are each the number of substituents, and each independently represent an integer of 0 to 5. m and m' are each independently preferably 0 or 1.

As the alkyl group of $R_9$ and $R_9'$, an alkyl group having 1 to 4 carbon atoms is preferable, a methyl group and an ethyl group are more preferable, and a methyl group is most preferable. Examples of the cycloalkyl group include cyclopropyl group, cyclobutyl group, cyclopentyl group, and a cyclohexyl group. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include alkoxy groups such as a hydroxy group, a methoxy group, and an ethoxy group, a cyano group, and halogen atoms such as a fluorine atom. $R_9$ and $R_9'$ are each more preferably a methyl group, a cyano group, or an alkoxycarbonyl group, and still more preferably a cyano group.

Examples of the alkylene group of X and X' include a methylene group and an ethylene group. X and X' are preferably an oxygen atom or a methylene group, and more preferably a methylene group.

In a case where m and m' are 1 or more, at least one of $R_9$ or $R_9'$ is preferably substituted at the α- or β-position of the carbonyl group of the lactone, and particularly preferably at the α-position.

Specific examples of the group having a lactone structure or the repeating unit having a sultone structure, represented by General Formula (III-1) or (III-1'), are shown, but the present invention is not limited thereto. In the following specific examples, R represents a hydrogen atom, an alkyl group which may have a substituent, or a halogen atom, and preferably a hydrogen atom, a methyl group, a hydroxymethyl group, or an acetoxymethyl group.

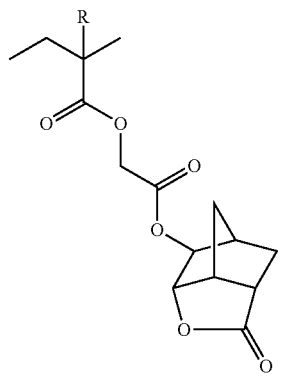

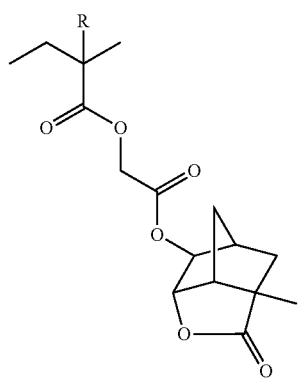

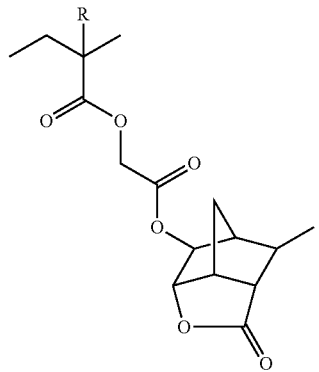

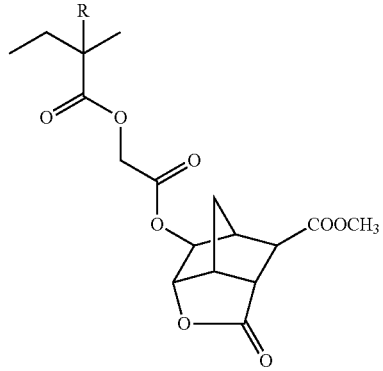

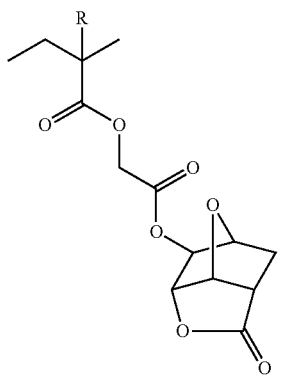
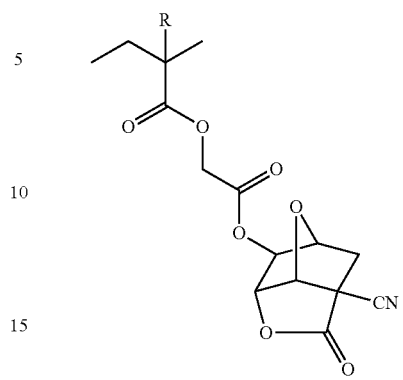
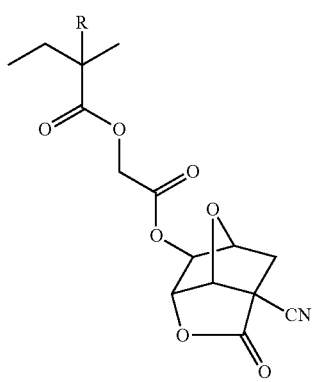
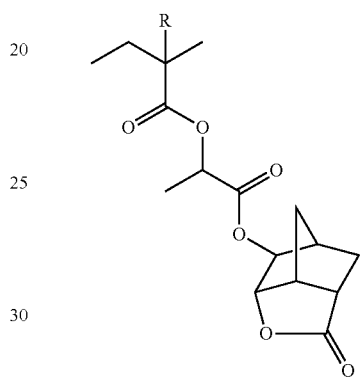
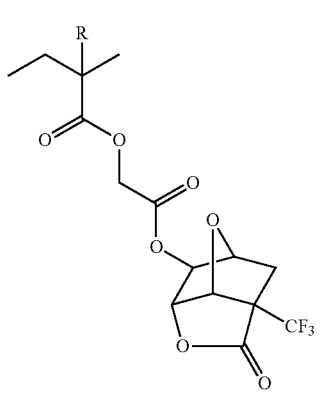
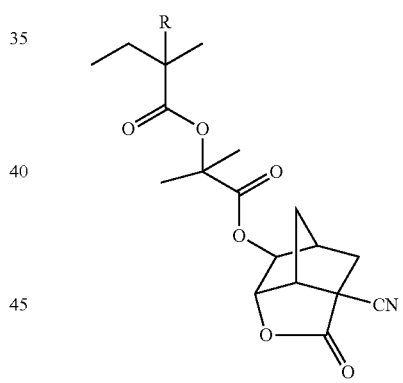
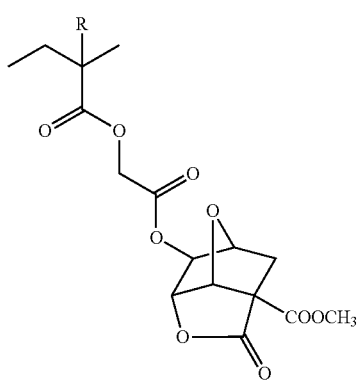
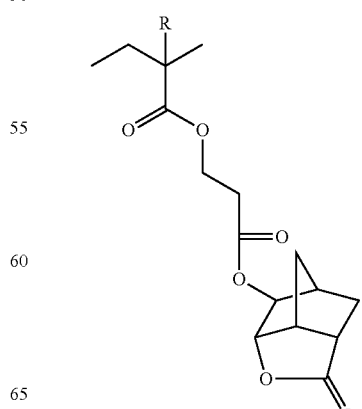

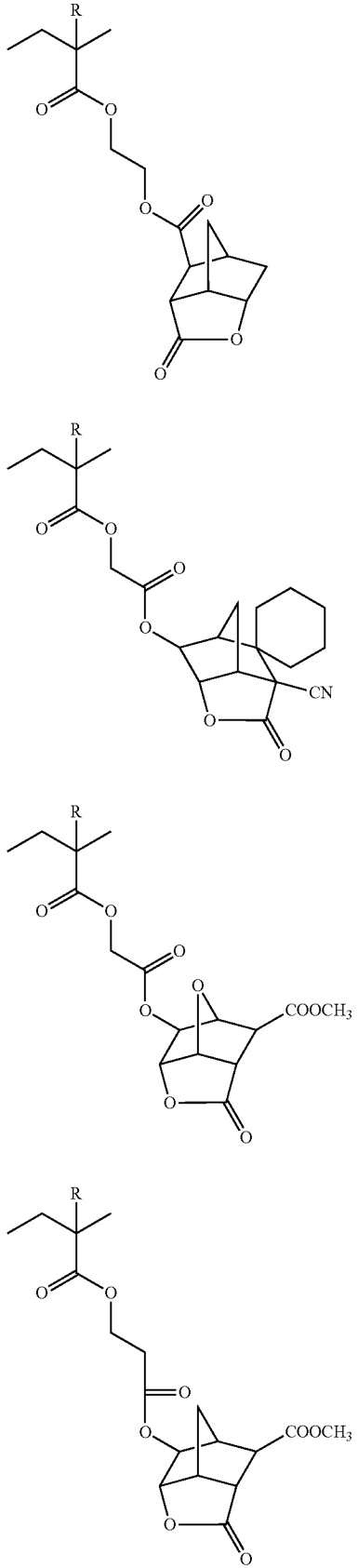
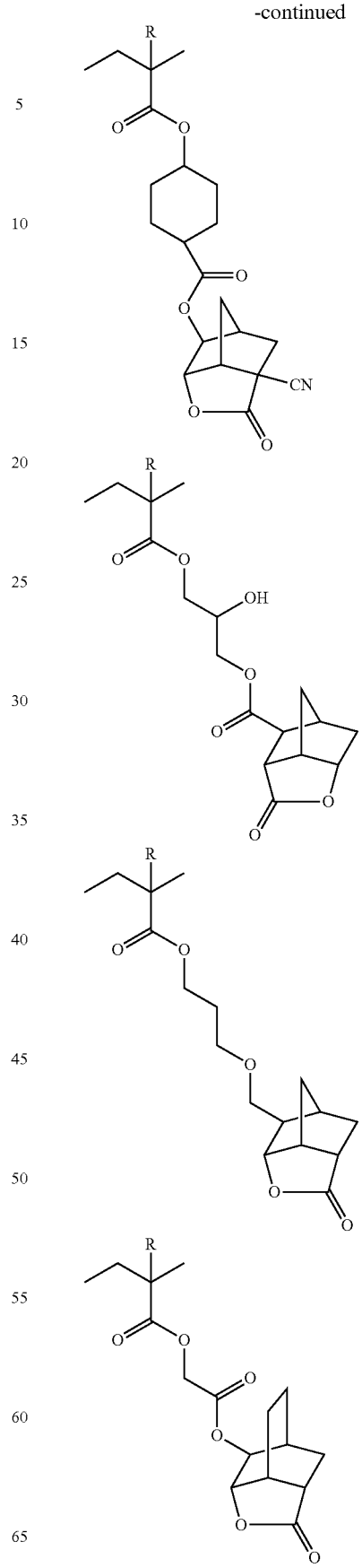

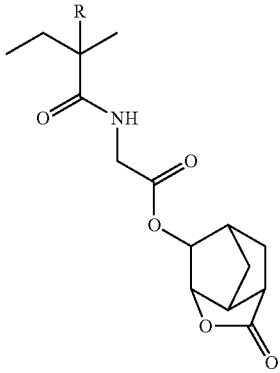

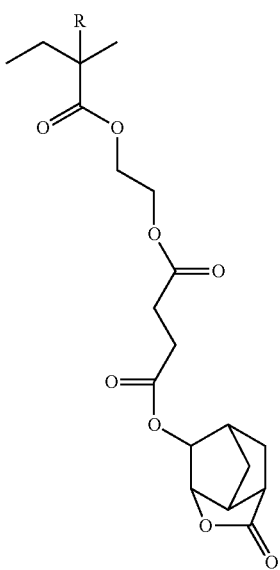

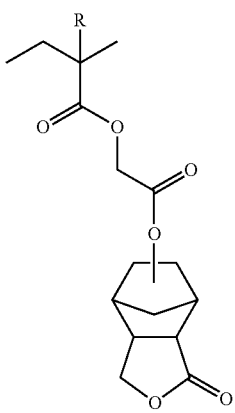

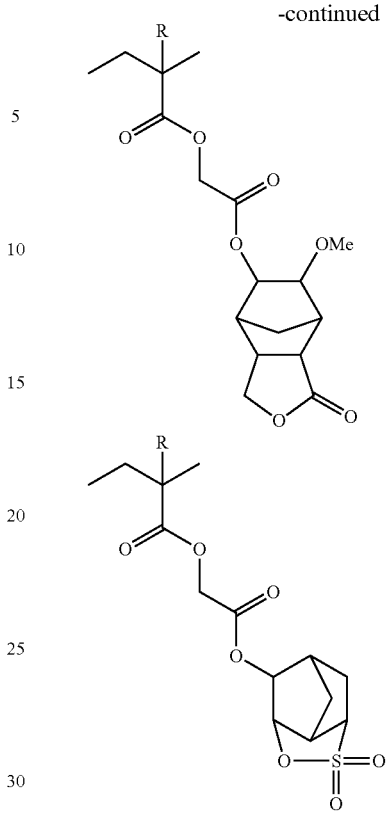

In a case where the repeating units are contained in plural kinds, the content of the repeating units represented by General Formula (III) is preferably 15% to 60% by mole, more preferably 20% to 60% by mole, and still more preferably 30% to 50% by mole, in total with respect to all the repeating units in the resin P.

The resin P may also contain the above-mentioned repeating unit having a lactone structure or a sultone structure, in addition to the unit represented by General Formula (III).

Specific examples of the repeating unit having a lactone structure or a sultone structure are shown below, but the present invention is not limited thereto.

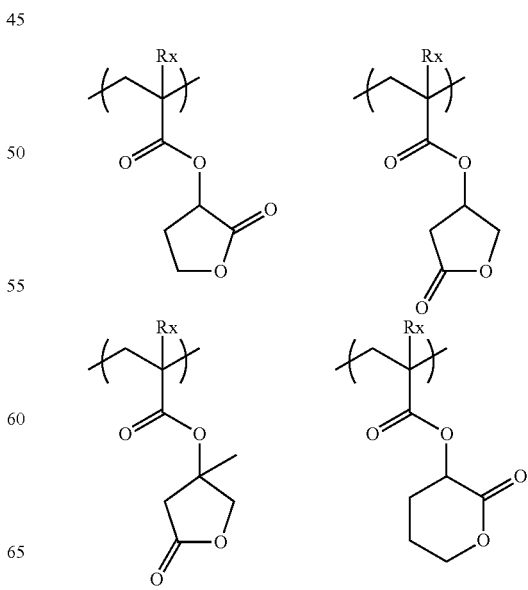

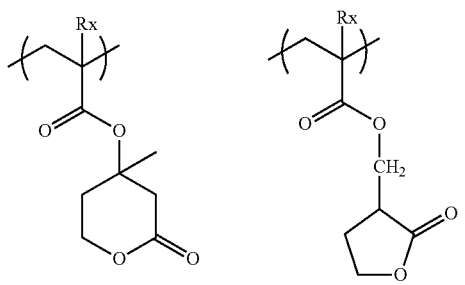
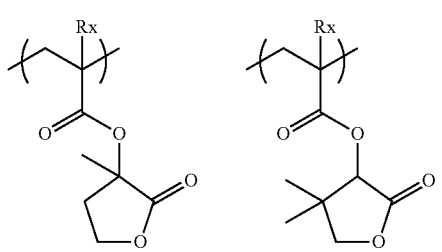
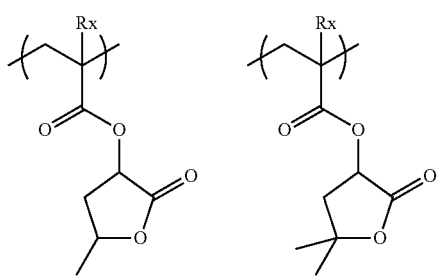
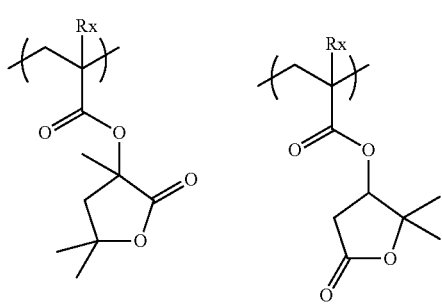
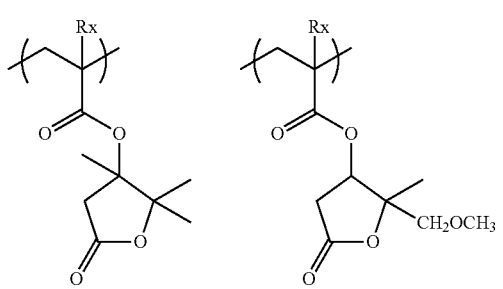
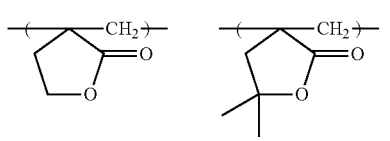
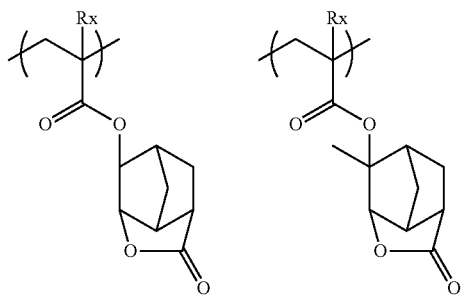
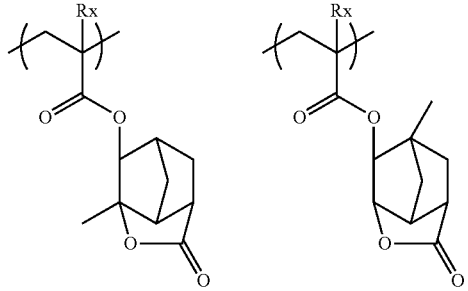
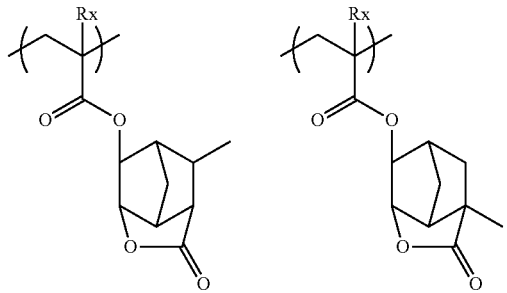
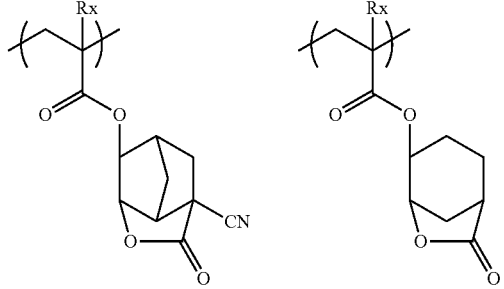
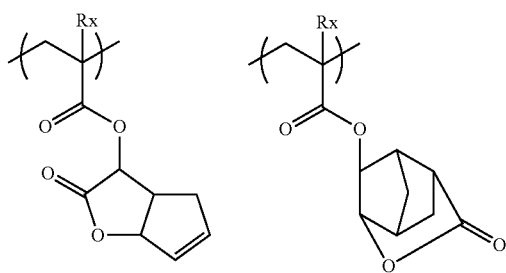
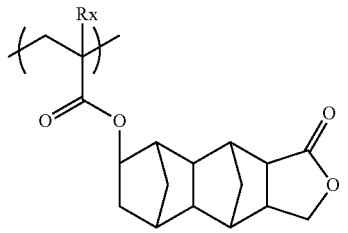

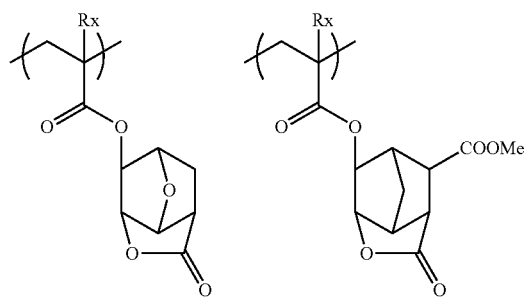
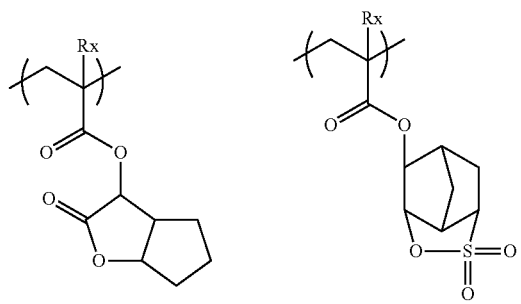
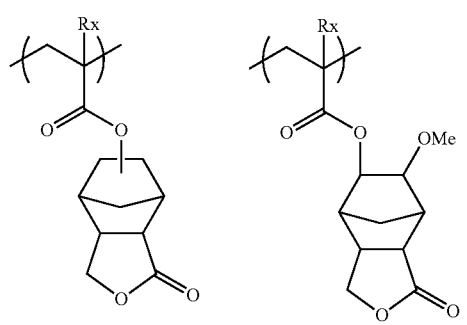
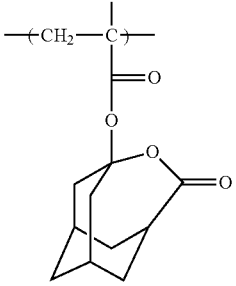
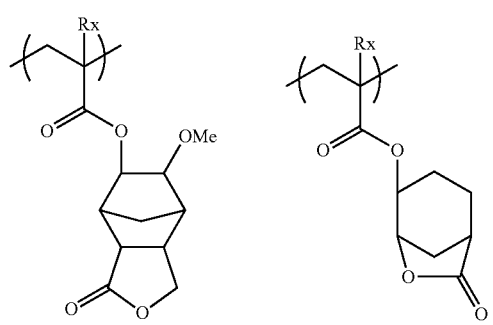
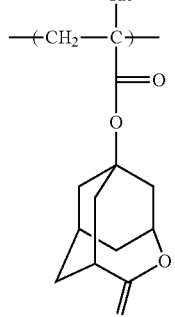
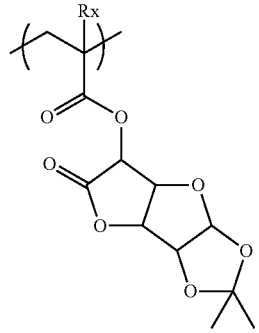
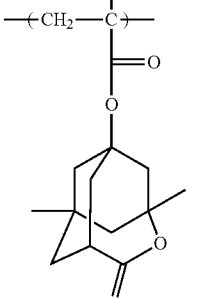
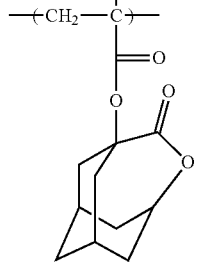
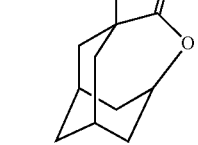
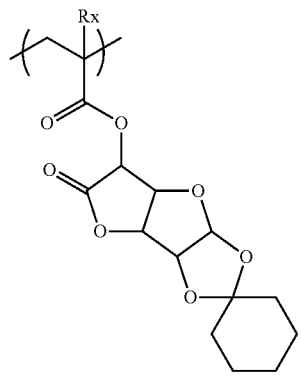
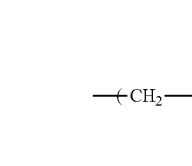

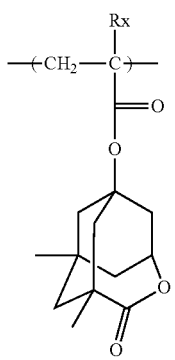
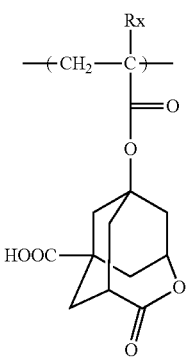
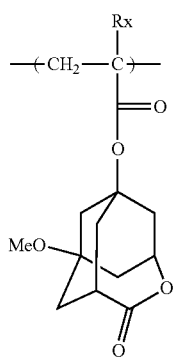
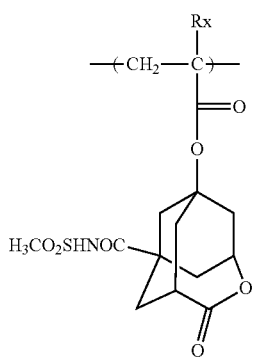

(in the formulae, Rx represents H, CH₃, CH₂OH, or CF₃)

Particularly preferred examples of the repeating units in the specific examples include the following repeating units. By selecting optimal lactone structures or sultone structures, a pattern profile and a density dependence are improved.

(in the formulae, Rx represents H, CH₃, CH₂OH, or CF₃)

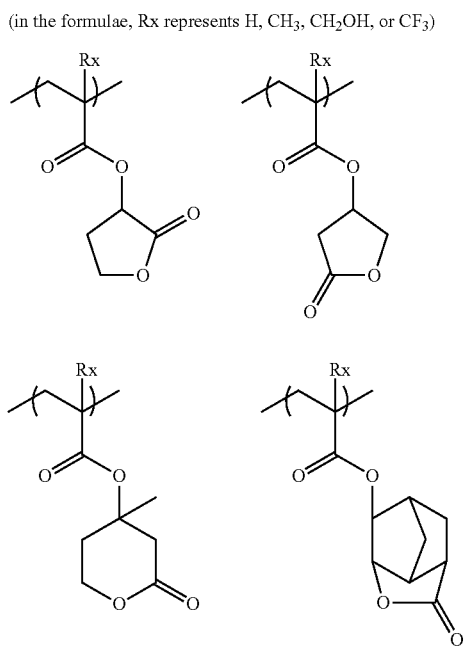

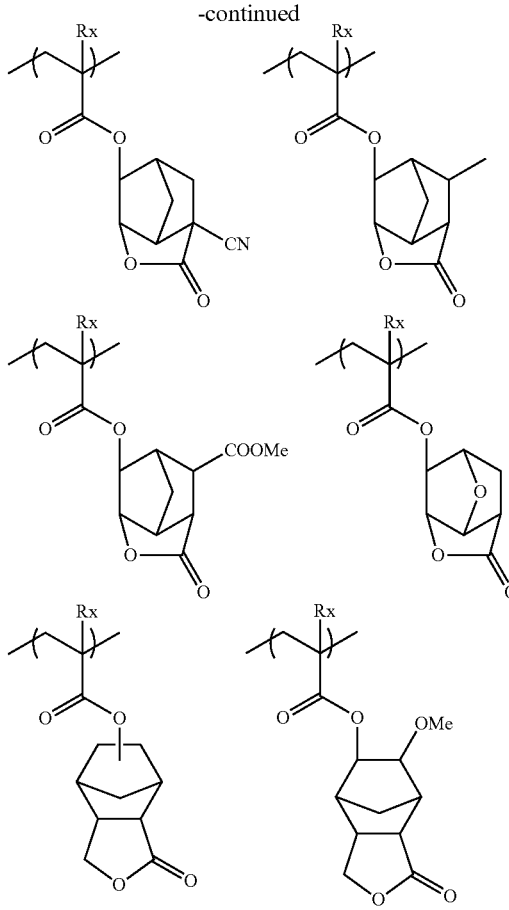

The repeating unit having a lactone structure or a sultone structure usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

In a case where the repeating units are contained in plural kinds, the content of the repeating units having a lactone structure or a sultone structure, other than the repeating units represented by General Formula (III), is preferably 15% to 60% by mole, more preferably 20% to 50% by mole, and still more preferably 30% to 50% by mole, in total with respect to all the repeating units in the resin.

In order to enhance the effects of the present invention, it is also possible to use two or more kinds of the lactone or sultone repeating units selected from General Formula (III) in combination. In a case of using them in combination, it is preferable to use two or more selected from the lactone or sultone repeating units of General Formula (III) in which n is 1 in combination.

[1-3-2] Repeating Unit Having Carbonate Structure

The carbonate structure (cyclic carbonic ester structure) is a structure having a ring including a bond represented by —O—C(=O)—O— as an atomic group constituting the ring. The ring including a bond represented by —O—C(=O)—O— as an atomic group constituting the ring is preferably a 5- to 7-membered ring, and most preferably a 5-membered ring. Such a ring may be fused with another ring to form a fused ring.

It is preferable that the resin P contains a repeating unit represented by the following General Formula (A-1) as a repeating unit having a carbonate structure (cyclic carbonic ester structure).

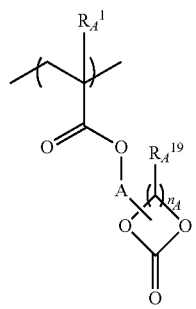

(A-1)

In General Formula (A-1), $R_A^1$ represents a hydrogen atom or an alkyl group.

$R_A^{19}$'s each independently represent a hydrogen atom or a chain hydrocarbon group.

A represents a single bond, a divalent or trivalent chain hydrocarbon group, a divalent or trivalent alicyclic hydrocarbon group, or a divalent or trivalent aromatic hydrocarbon group, and in a case where A is trivalent, a carbon atom included in A are bonded to the carbon atom constituting a cyclic carbonic ester to form a ring structure.

$n_A$ represents an integer of 2 to 4.

In General Formula (A-1), $R_A^1$ represents a hydrogen atom or an alkyl group. The alkyl group represented by $R_A^1$ may have a substituent such as a fluorine atom. $R_A^1$ preferably represents a hydrogen atom, a methyl group, or a trifluoromethyl group, and more preferably a methyl group.

$R_A^{19}$'s each independently represent a hydrogen atom or a chain hydrocarbon group. The chain hydrocarbon group represented by $R_A^{19}$ is preferably a chain hydrocarbon group having 1 to 5 carbon atoms. Examples of the "chain hydrocarbon group having 1 to 5 carbon atoms" include linear alkyl groups having 1 to 5 carbon atoms, such as a methyl group, an ethyl group, a propyl group, and a butyl group; and branched alkyl groups having 3 to 5 carbon atoms, such as an isopropyl group, an isobutyl group, and a t-butyl group. The chain hydrocarbon groups may have a substituent such as a hydroxyl group.

$R_A^{19}$ most preferably represents a hydrogen atom.

In General Formula (A-1), $n_A$ represents an integer of 2 to 4. That is, in a case of n=2 (an ethylene group), the cyclic carbonic ester is a 5-membered ring structure; in a case of n=3 (a propylene group), the cyclic carbonic ester is a 6-membered ring structure; and in a case of n=4 (a butylene group), the cyclic carbonic ester is a 7-membered ring structure. For example, the repeating unit (A-1a) which will be described later is a 5-membered ring structure, and (A-1j) is an example of the 6-membered ring structure.

$n_A$ is preferably 2 or 3, and more preferably 2.

In General Formula (A-1), A represents a single bond, divalent or trivalent chain hydrocarbon group, a divalent or trivalent alicyclic hydrocarbon group, or a divalent or trivalent aromatic hydrocarbon group.

The divalent or trivalent chain hydrocarbon group is preferably a divalent or trivalent chain hydrocarbon group having 1 to 30 carbon atoms.

The divalent or trivalent alicyclic hydrocarbon group is preferably a divalent or trivalent alicyclic hydrocarbon group having 3 to 30 carbon atoms.

The divalent or trivalent aromatic hydrocarbon group is preferably a divalent or trivalent aromatic hydrocarbon group having 6 to 30 carbon atoms.

In a case where A is a single bond, the oxygen atom of an (alkyl)acrylic acid (typically a (meth)acrylic acid) to which $R_A^1$ is bonded at the α-position constituting a polymer is directly bonded to the carbon atom constituting the cyclic carbonic ester.

The "chain hydrocarbon group" is used to mean a hydrocarbon group that does not include a cyclic structure in the main chain, and includes only a chain structure. Examples of the "divalent chain hydrocarbon group having 1 to 30 carbon atoms" include linear alkylene groups such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an eicosylene group; and branched alkylene groups such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group. Examples of the "trivalent chain hydrocarbon group having 1 to 30 carbon atoms" include a group produced by elimination of one hydrogen atom from the functional group.

Examples of the structure in a case where A is the chain hydrocarbon group include a structure in which the oxygen atom of an (alkyl)acrylic acid (typically a (meth)acrylic acid) to which $R_A^1$ is bonded at the α-position constituting a polymer is bonded to the carbon atom constituting the cyclic carbonic ester through a linear alkylene group having 1 to 5 carbon atoms (the repeating units (A-1a) to (A-1f) which will be described later). In this structure, a cyclic structure may be included as a substituent of A (the repeating unit (A-1p) which will be described later).

A carbon atom included in A and a carbon atom constituting the cyclic carbonic ester may be bonded to each other to form a ring structure. That is, the cyclic carbonic ester may be a part of a fused ring or a Spiro ring. A fused ring is formed in a case where two carbon atoms of the cyclic carbonic ester are included in the ring structure, and a spiro ring is formed in a case where only one carbon atom of the cyclic carbonic ester is included. The repeating units (A-1g), (A-1q), (A-1t), (A-1u), (A-1i), (A-1r), (A-1s), (A-1v), and (A-1w) which will be described later are examples in which a fused ring including a carbon atom included in A and two carbon atoms constituting the cyclic carbonic ester is formed. On the other hand, the repeating unit (A-1j) which will be described later is an example in which a spiro ring is formed by a carbon atom included in A and one carbon atom constituting the cyclic carbonic ester. In addition, the ring structure may be a heterocyclic ring (the repeating units (A-1 q to A-1v) which will be described later).

The "alicyclic hydrocarbon group" means a hydrocarbon group that includes only an alicyclic hydrocarbon structure and does not include an aromatic ring structure, as a ring structure. Here, the alicyclic hydrocarbon group does not necessarily need to be formed only of an alicyclic hydrocarbon structure, but may partly include a chain structure.

Examples of the "divalent alicyclic hydrocarbon group" include monocyclic cycloalkylene groups having 3 to 10 carbon atoms, such as a 1,3-cyclobutylene group, a 1,3-cyclopentylene group, a 1,4-cyclohexylene group, and a 1,5-cyclooctylene group; and polycyclic cycloalkylene groups such as a 1,4-norbornylene group, a 2,5-norbornylene group, a 1,5-adamantylene group, and a 2,6-adamantylene group. Examples of the "trivalent alicyclic hydrocarbon group" include a group produced by elimination of one hydrogen atom from the functional groups, and the like.

Examples of the structure in a case where A is the alicyclic hydrocarbon group include a structure in which the oxygen atom of an (alkyl)acrylic acid (typically a (meth)acrylic acid) to which $R_A^1$ is bonded at the α-position constituting a polymer is bonded to the carbon atom constituting the cyclic carbonic ester through a cyclopentylene group (the repeating units (A-1g) and (A-1h) which will be described later), through a norbornylene group (the repeating units (A-1j), (A-1k), and (A-1l) which will be described later), or through a substituted tetradecahydrophenanthryl group (the repeating unit (A-1n) which will be described later).

Moreover, the repeating units (A-1k) and (A-1l) which will be described later are examples in which a fused ring which includes a carbon atom included in A and two carbon atoms constituting the cyclic carbonic ester is formed. On the other hand, the repeating units (A-1j) and (A-1n) which will be described later are examples in which a Spiro ring is formed by a carbon atom included in A and one carbon atom constituting the cyclic carbonic ester.

The "aromatic hydrocarbon group" means a hydrocarbon group that includes an aromatic ring structure as a ring structure. Here, the aromatic hydrocarbon group does not necessarily need to be formed only of an aromatic ring structure, but may include a chain structure or an alicyclic hydrocarbon structure in a part thereof.

Examples of the "divalent aromatic hydrocarbon group" include arylene groups such as a phenylene group, a tolylene group, a naphthylene group, a phenanthrylene group, and an anthrylene group. Examples of the "trivalent aromatic hydrocarbon group" include a group produced by elimination of one hydrogen atom from the functional groups.

Examples of the structure in which A is the aromatic hydrocarbon group include a structure in which the oxygen atom of an (alkyl)acrylic acid (typically a (meth)acrylic acid) to which $R_A^1$ is bonded at the α-position constituting a polymer is bonded to the carbon atom constituting the cyclic carbonic ester through a benzylene group (the repeating unit (A-1o) which will be described later). The repeating unit (A-1o) is an example in which a fused ring including a carbon atom included in A and two carbon atoms constituting the cyclic carbonic ester is formed.

A preferably represents a divalent or trivalent chain hydrocarbon group, or a divalent or trivalent alicyclic hydrocarbon group, more preferably represents a divalent or trivalent chain hydrocarbon group, and still more preferably represents a linear alkylene group having 1 to 5 carbon atoms.

The monomer can be synthesized by the method known in the related art, for example, described in Tetrahedron Letters, Vol. 27, No. 32 p. 3741 (1986), and Organic Letters, Vol. 4, No. 15 p. 2561 (2002).

Specific examples of the repeating unit represented by General Formula (A-1) (repeating units (A-1a) to (A-1w)) are shown below, but the present invention is not limited thereto.

Furthermore, $R_A^1$ in the following specific examples has the same definition as $R_A^1$ in General Formula (A-1).

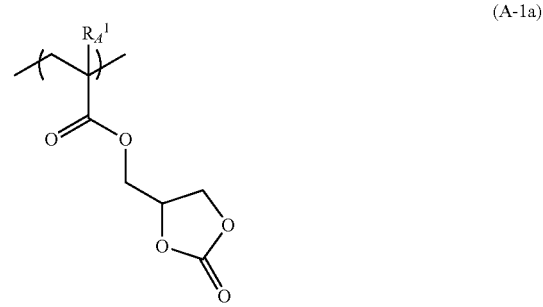

(A-1a)

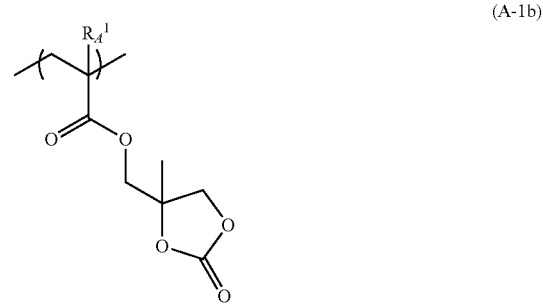

(A-1b)

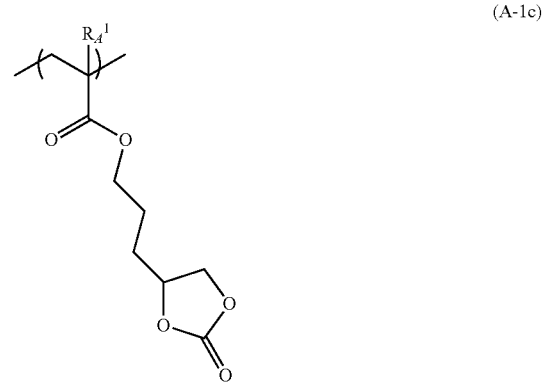

(A-1c)

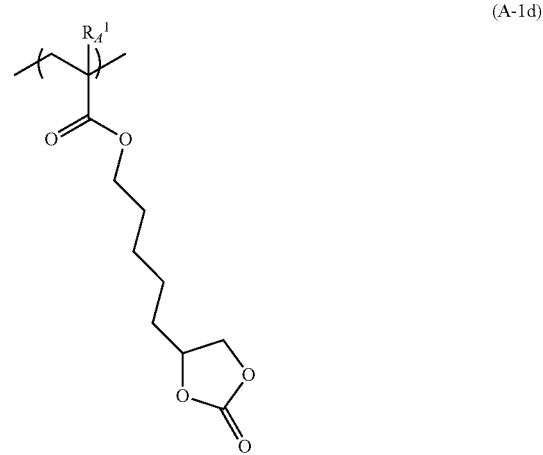

(A-1d)

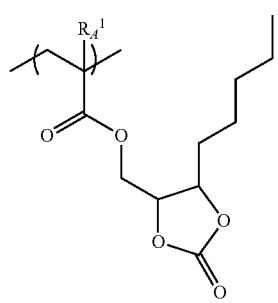 (A-1e)
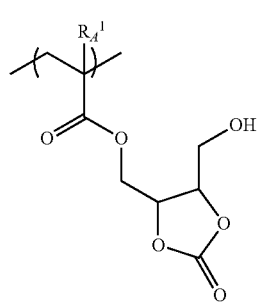 (A-1f)
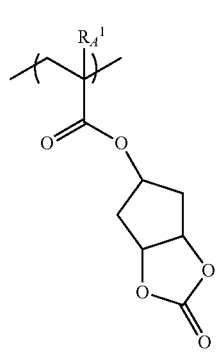 (A-1g)
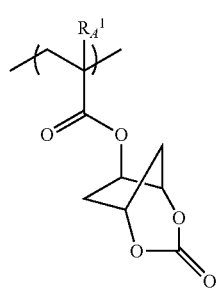 (A-1h)
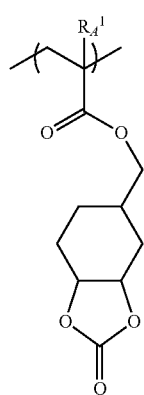 (A-1i)
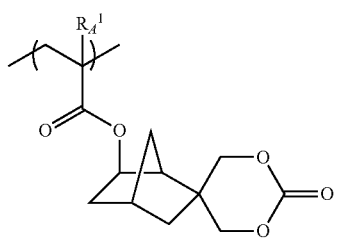 (A-1j)
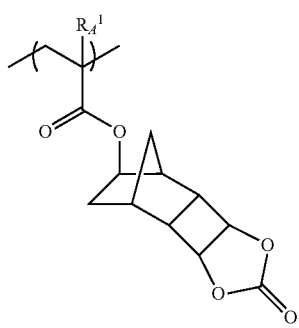 (A-1k)
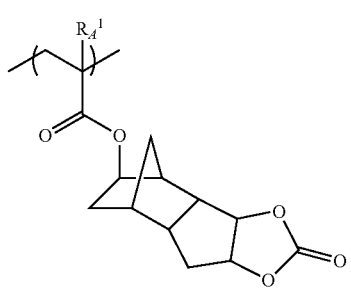 (A-1l)
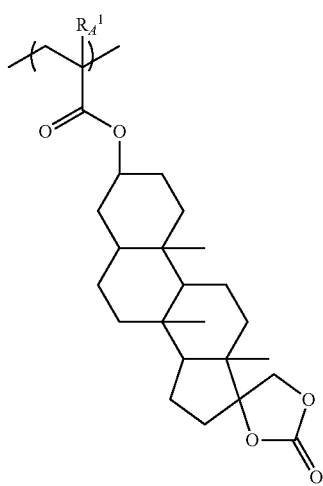 (A-1n)

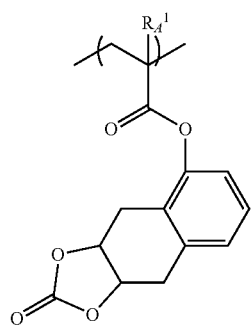 (A-1o)
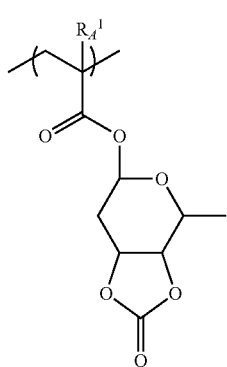 (A-1s)
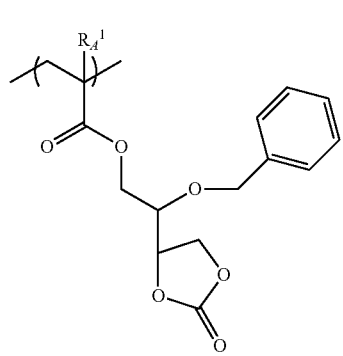 (A-1p)
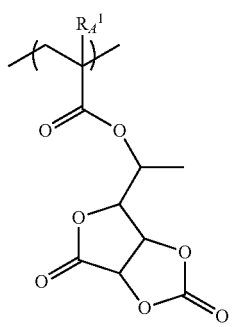 (A-1t)
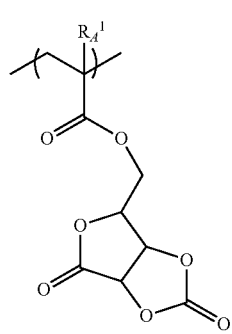 (A-1q)
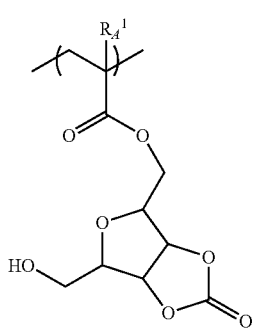 (A-1u)
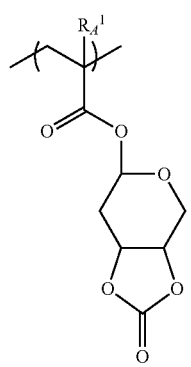 (A-1r)
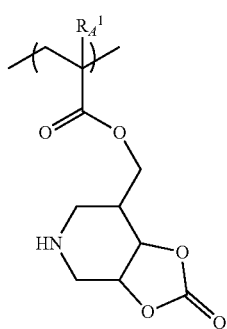 (A-1v)

(A-1w)

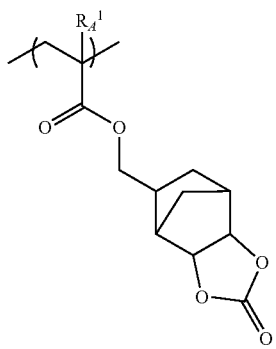

The resin P may include only one kind or two or more kinds of the repeating unit represented by General Formula (A-1).

In the resin P, the content of the repeating units having a carbonate structure (cyclic carbonic ester structure) (preferably a repeating unit represented by General Formula (A-1)) is preferably 3% to 80% by mole, more preferably 3% to 60% by mole, particularly preferably 3% to 30% by mole, and most preferably 10% to 15% by mole, with respect to all the repeating units constituting the resin P.

Suitable examples of the repeating unit (b) include the repeating units described in [1-3-1] and [1-3-2] above, and among these, in view of obtaining more excellent effects of the present invention, a repeating unit represented by any one of the following General Formulae (b1) to (b7) is more preferable.

(b1)

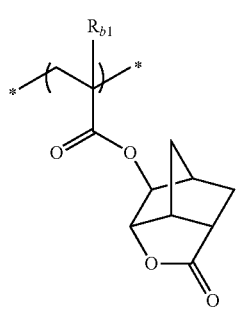

(b2)

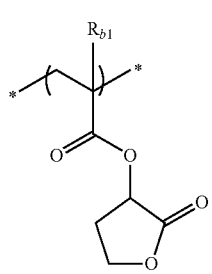

(b3)

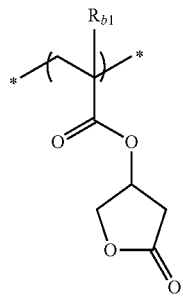

(b4)

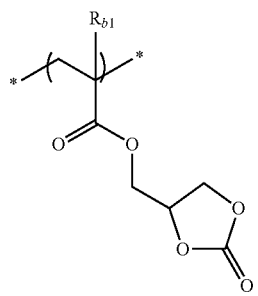

(b5)

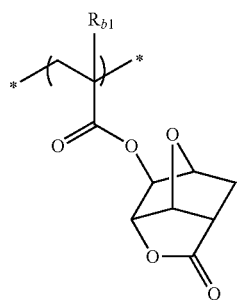

(b6)

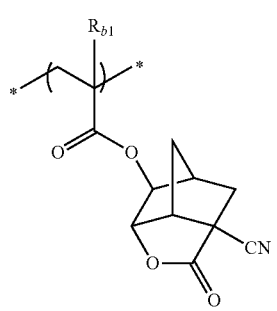

(b7)

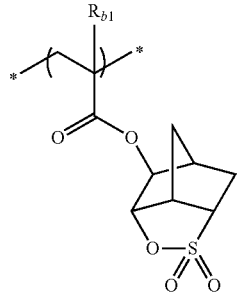

Here, in General Formulae (b1) to (b7), $R_{b1}$'s each independently represent a hydrogen atom or an organic group. Examples of the organic group represented by $R_{b1}$ in General Formulae (b1) to (b7) include an alkyl group which may have a substituent such as a fluorine atom and a hydroxyl group, and the organic group is preferably a hydrogen atom, a methyl group, a trifluoromethyl group, or a hydroxymethyl group, and more preferably a hydrogen atom or a methyl group.

[1-4] Other Repeating Units

The resin P may include other repeating units.

For example, the resin P may include a repeating unit having a hydroxyl group or a cyano group. Examples of such a repeating unit include the repeating units described in paragraphs [0081] to [0084] of JP2014-098921A.

Furthermore, the resin P may have a repeating unit having an alkali-soluble group. Examples of the alkali-soluble group include a carboxyl group, a sulfonamido group, a sulfonylimido group, a bisulfonylimido group, and an aliphatic alcohol group with the α-position being substituted with an electron-withdrawing group (for example, a hexafluoroisopropanol group). Examples of the repeating unit having an alkali-soluble group include the repeating units described in paragraphs [0085] and [0086] of JP2014-098921A.

Moreover, the resin P can have a repeating unit which has an alicyclic hydrocarbon structure not having a polar group (for example, an alkali-soluble group, a hydroxyl group, and a cyano group), and does not exhibit acid decomposability. Examples of such a repeating unit include the repeating units described in paragraphs [0114] to [0123] of JP2014-106299A.

Furthermore, the resin P may include the repeating units described in, for example, paragraphs [0045] to [0065] of JP2009-258586A.

In addition to the repeating structural units, the resin P used in the composition of the present invention can have a variety of repeating structural units for the purpose of adjusting dry etching resistance, suitability for a standard developer, adhesiveness to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin used in the composition of the present invention, in particular, (1) solubility with respect to a coating solvent, (2) film-forming properties (glass transition point), (3) alkali developability, (4) film reduction (selection of hydrophilic, hydrophobic, or alkali-soluble groups), (5) adhesiveness of an unexposed area to a substrate, (6) dry etching resistance, and the like.

Examples of such a monomer include a compound having one addition-polymerizable unsaturated bond selected from acrylic esters, methacrylic esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin P used in the composition of the present invention, the molar ratio of each repeating structural unit content is appropriately set in order to adjust dry etching resistance, suitability for a standard developer, adhesiveness to a substrate, and a resist profile of the resist, and in addition, resolving power, heat resistance, sensitivity, and the like, each of which is performance generally required for the resist.

When the composition of the present invention is for ArF exposure, it is preferable that the resin P used in the composition of the present invention does not substantially have an aromatic group in terms of transparency to ArF light. More specifically, the proportion of repeating units having an aromatic group in all the repeating units of the resin P is preferably 5% by mole or less, and more preferably 3% by mole or less, and ideally 0% by mole of all the repeating units, that is, it is even more preferable that the resin P does not have a repeating unit having an aromatic group. Further, it is preferable that the resin P has a monocyclic or polycyclic alicyclic hydrocarbon structure.

Furthermore, it is preferable that the resin P contains neither a fluorine atom nor a silicon atom from the viewpoint of compatibility with a hydrophobic resin (D) which will be described later.

The resin P used in the composition of the present invention is preferably a resin in which all the repeating units are composed of (meth)acrylate-based repeating units. In this case, all the repeating units may be methacrylate-based repeating units, all the repeating units may be acrylate-based repeating units, or all the repeating units may be composed of methacrylate-based repeating units and acrylate-based repeating units, but the acrylate-based repeating units preferably accounts for 50% by mole or less with respect to all the repeating units.

The resin P in the present invention can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is more preferable to perform polymerization using the same solvent as the solvent used in the composition of the present invention. Thus, generation of the particles during storage can be inhibited.

It is preferable that the polymerization reaction is carried out in an inert gas atmosphere such as nitrogen and argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group, or a carboxyl group is preferable. Preferable initiators include azobisisobutyronitrile, azobisdimethylvaleronitrile, dimethyl 2,2'-azobis(2-methyl propionate), or the like. The initiator is added or added in portionwise, as desired, a desired polymer is recovered after the reaction is completed, the reaction mixture is poured into a solvent, and then a method such as powder or solid recovery is used. The concentration of the reactant is 5% to 50% by mass and preferably 10% to 30% by mass. The reaction temperature is normally 10° C. to 150° C., preferably 30° C. to 120° C., and more preferably 60° C. to 100° C.

The weight-average molecular weight of the resin P in the present invention is preferably 1,000 to 200,000, more preferably 2,000 to 20,000, still more preferably 3,000 to 15,000, and particularly preferably 3,000 to 11,000, as values in terms of polystyrene, determined by a GPC method. By setting the weight-average molecular weight to 1,000 to 200,000, it is possible to prevent the deterioration of heat resistance or dry-etching resistance, and also prevent the deterioration of film forming properties due to deteriorated developability or increased viscosity.

The dispersity (molecular weight distribution) is usually 1.0 to 3.0, and the dispersity in the range of preferably 1.0 to 2.6, more preferably 1.0 to 2.0, and particularly preferably 1.1 to 2.0 is used. As the molecular weight distribution is smaller, the resolution and the resist shape are better, the side wall of the resist pattern is smoother, and the roughness is better.

The content of the resin P in the entire composition is preferably 30% to 99% by mass, and more preferably 50% to 95% by mass, with respect to the total solid contents.

Furthermore, the resin P may be used singly or in combination of plural kinds thereof.

[2] Compound That Generates Acid upon Irradiation with Active Light or Radiation The composition of the present invention contains a compound that generates an acid upon irradiation with active light or radiation (hereinafter also referred to as an "acid generator"). The acid generator is not particularly limited, but is preferably a compound that generates an organic acid upon irradiation with active light or radiation.

The acid generator may be appropriately selected from known compounds that generate an acid upon irradiation with active light or radiation which are used for a photo-initiator for cationic photopolymerization, a photo-initiator for radical photopolymerization, a photo-decoloring agent for dyes, a photo-discoloring agent, a microresist or the like, and a mixture thereof, and used. Examples thereof include the compounds described in paragraphs [0039] to [0103] of JP2010-61043A, the compounds described in paragraphs [0284] to [0389] of JP2013-4820A, and the like, but the present invention is not limited thereto.

Examples of such an acid generator include a diazonium salt, a phosphonium salt, a sulfonium salt, an iodonium salt, imide sulfonate, oxime sulfonate, diazodisulfone, disulfone, and o-nitrobenzyl sulfonate.

Suitable examples of the acid generator contained in the composition of the present invention include a compound (a specific acid generator) that generates an acid upon irradiation with active light or radiation represented by the following General Formula (3).

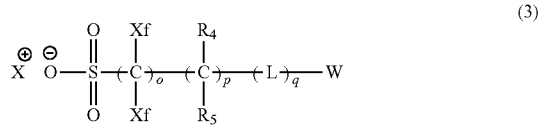

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each represent a hydrogen atom, a fluorine atom, an alkyl group, or an alkyl group substituted with at least one fluorine atom, and in a case where $R_4$ and $R_5$ are present in plural numbers, they may be the same as or different from each other.

The alkyl group as $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same as the specific examples and suitable aspects of Xf in General Formula (3).

L represents a divalent linking group, and in a case where L's are present in plural numbers, they may be the same as or different from each other.

Examples of the divalent linking group include —COO—, —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group- is preferable, and —COO—, —OCO—, —CONH—, —COO-alkylene group-, or —OCO-alkylene group- is more preferable.

W represents an organic group including a cyclic structure. Above all, it is preferably a cyclic organic group.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable from the viewpoints of inhibiting diffusivity into the film during post exposure baking (PEB) process and improving Mask Error Enhancement Factor (MEEF).

The aryl group may be monocyclic or polycyclic. Examples of the aryl group include a phenyl group, a naphthyl group, a phenanthryl group, and an anthryl group.

Among these, a naphthyl group showing a relatively low light absorbance at 193 nm is preferable.

The heterocyclic group may be monocyclic or polycyclic, but is preferably polycyclic so as to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the lactone structures and sultone structures exemplified in the above-mentioned resin P.

The cyclic organic group may have a substituent. Examples of the substituent include, an alkyl group (which may be linear or branched, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (the carbon contributing to ring formation) may be carbonyl carbon.

o represents an integer of 1 to 3. p represents an integer of 0 to 10. q represents an integer of 0 to 10.

In one aspect, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diamantyl group.

(Cation)

In General Formula (3), $X^+$ represents a cation. $X^+$ is not particularly limited as long as it is a cation, but suitable aspects thereof include cations (parts other than $Z^-$) in General Formula (ZI), (ZII), or (ZIII) which will be described later.

(Suitable Aspects)

Suitable aspects of the specific acid generator include a compound represented by the following General Formula (ZI), (ZII), or (ZIII).

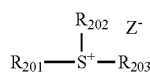

(ZI)

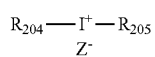

(ZII)

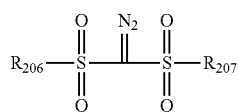

(ZIII)

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two members out of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two members out of $R_{201}$ to $R_{203}$ include an alkylene group (for example, a butylene group and a pentylene group).

$Z^-$ represents an anion in General Formula (3), and specifically represents the following anion.

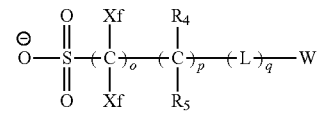

Examples of the organic group represented by $R_{201}$, $R_{202}$, and $R_{203}$ include groups corresponding to the compounds (ZI-1), (ZI-2), (ZI-3), and (ZI-4), which will be described later.

Incidentally, it may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

More preferred examples of the component (ZI) include the compounds (ZI-1), (ZI-2), (ZI-3), and (ZI-4) described below.

First, the compound (ZI-1) will be described.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as the substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by the following General Formula (ZI-3), which is a compound having a phenacylsulfonium salt structure.

Among any two or more members out of $R_{1c}$ to $R_{5c}$, $R_{5c}$ and $R_{6c}$, $R_{6c}$ and $R_{7c}$, $R_{5c}$ and $R_x$, and $R_x$ and $R_y$ each may be bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_7$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples thereof include a methylene group and an ethylene group.

$Z_c^-$ represents an anion in General Formula (3), and specifically, is the same as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) in the present invention include the cations described under paragraph [0036] of the specification of US2012/0076996A.

Next, the compound (ZI-4) will be described.

The compound (ZI-4) is represented by the following General Formula (ZI-4).

(ZI-3)

(ZI-4)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. When two $R_{15}$'s are bonded to form a ring, the ring skeleton may include a heteroatom such as an oxygen atom and a nitrogen atom. In one aspect, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, is as described above.

In General Formula (ZI-4), as the alkyl group of $R_{13}$, $R_{14}$, and $R_{15}$, an alkyl which is linear or branched and has 1 to 10 carbon atoms is preferable, and preferred examples thereof include a methyl group, an ethyl group, an n-butyl group, and a t-butyl group.

Examples of the cation of the compound represented by General Formula (ZI-4) in the present invention include the cations described in paragraphs [0121], [0123], and [0124] of JP2010-256842A, paragraphs [0127], [0129], and [0130] of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in $R_{20}4$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of $R_{204}$ to $R_{207}$ may have a substituent. Examples of the substituent which the aryl group, the alkyl group, or the cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generator (including a specific acid generator, which applies hereinafter) may be in a form of a low molecular compound or in a form introduced into a part of a polymer. Further, a combination of the form of a low molecular compound and the form introduced into a part of a polymer may also be used.

In a case where the acid generator is in the form of a low molecular compound, the molecular weight is preferably 3,000 or less, more preferably 2,000 or less, and still more preferably 1,000 or less.

In a case where the acid generator is in the form introduced into a part of a polymer, it may be introduced into a part of the resin P described above or into a resin other than the resin P.

The acid generator can be synthesized by a known method, and can be synthesized by, for example, the method described in JP2007-161707A.

The acid generators may be used singly or in combination of two or more kinds thereof.

The content of the acid generator (a total sum of contents in a case where the acid generators are present in plural kinds) in the composition is preferably 0.1% to 30% by mass, more preferably 0.5% to 25% by mass, still more preferably 3% to 20% by mass, and particularly preferably 3% to 15% by mass, with respect to the total solid content of the composition.

Furthermore, the content of the acid generator (a total sum of contents in a case where the acid generators are present in plural kinds) in a case where the acid generator is a specific acid generator represented by General Formula (ZI-3) or (ZI-4) is preferably 5% to 35% by mass, more preferably 8% to 30% by mass, still more preferably 9% to 30% by mass, and particularly preferably 9% to 25% by mass, with respect to the total solid content of the composition.

[3] Hydrophobic Resin

The composition of the present invention may contain a hydrophobic resin (hereinafter also referred to as a "hydrophobic resin (D)" or simply a "resin (D)"). Further, the hydrophobic resin (D) is preferably different from the resin P.

Although the hydrophobic resin (D) is preferably designed to be unevenly localized on an interface, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and suppression of out gas.

The hydrophobic resin (D) preferably has at least one of a "fluorine atom," a "silicon atom," or a "$CH_3$ partial structure which is contained in a side chain portion of a resin" from the point of view of uneven distribution on the film surface layer, and more preferably has two or more kinds.

In a case where hydrophobic resin (D) includes a fluorine atom and/or a silicon atom, the fluorine atom and/or the silicon atom in the hydrophobic resin (D) may be contained in the main chain or the side chain of the resin.

In a case where the hydrophobic resin (D) contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom and the aryl group having a fluorine atom are a cycloalkyl group in which one hydrogen atom is substituted with a fluorine atom, and an aryl group having a fluorine atom, respectively, and may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

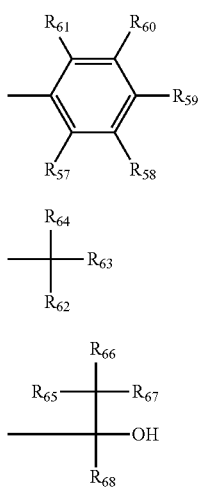

(F2)

(F3)

(F4)

In General Formulae (F2) to (F4), $R_{57}$ to $R_{68}$ each independently represent a hydrogen atom, a fluorine atom, or an (linear or branched) alkyl group, provided that at least one of $R_{57}$, ..., or $R_{61}$, at least one of $R_{62}$, ..., or $R_{64}$, and at least one of $R_{65}$, ..., or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

The hydrophobic resin (D) may contain a silicon atom. It is preferably a resin having, as the partial structure having a silicon atom, an alkylsilyl structure (preferably a trialkylsilyl group) or a cyclic siloxane structure.

Examples of the repeating unit having a fluorine atom or a silicon atom include those exemplified in [0519] of US2012/0251948A1.

Moreover, it is also preferable that the hydrophobic resin (D) contains a $CH_3$ partial structure in the side chain portion as described above.

Here, the $CH_3$ partial structure (hereinafter also simply referred to as a "side chain $CH_3$ partial structure") contained in the side chain portion in the hydrophobic resin (D) includes a $CH_3$ partial structure contained in an ethyl group, a propyl group, and the like.

On the other hand, a methyl group bonded directly to the main chain of the hydrophobic resin (D) (for example, an α-methyl group in the repeating unit having a methacrylic acid structure) makes only a small contribution of uneven distribution to the surface of the hydrophobic resin (D) due to the effect of the main chain, and it is therefore not included in the $CH_3$ partial structure in the present invention.

More specifically, in a case where the hydrophobic resin (D) contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves," such $CH_3$ is not included in the $CH_3$ partial structure contained in the side chain portion in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the hydrophobic resin has "one" $CH_3$ partial structure in the present invention.

(M)

In General Formula (M), $R_{11}$ to $R_{14}$ each independently represent a side chain portion.

Examples of $R_{11}$ to $R_{14}$ at the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin (D) is preferably a resin including a repeating unit having the $CH_3$ partial structure in the side chain portion thereof. Further, the hydrophobic resin more preferably has, as such a repeating unit, at least one repeating unit (x) selected from a repeating unit represented by the following General Formula (II) or a repeating unit represented by the following General Formula (III).

Hereinafter, the repeating unit represented by General Formula (II) will be described in detail.

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have an "acid-decomposable group" described with respect to the resin P.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.

Specific preferred examples of the repeating unit represented by General Formula (II) are shown below, but the present invention is not limited thereto.

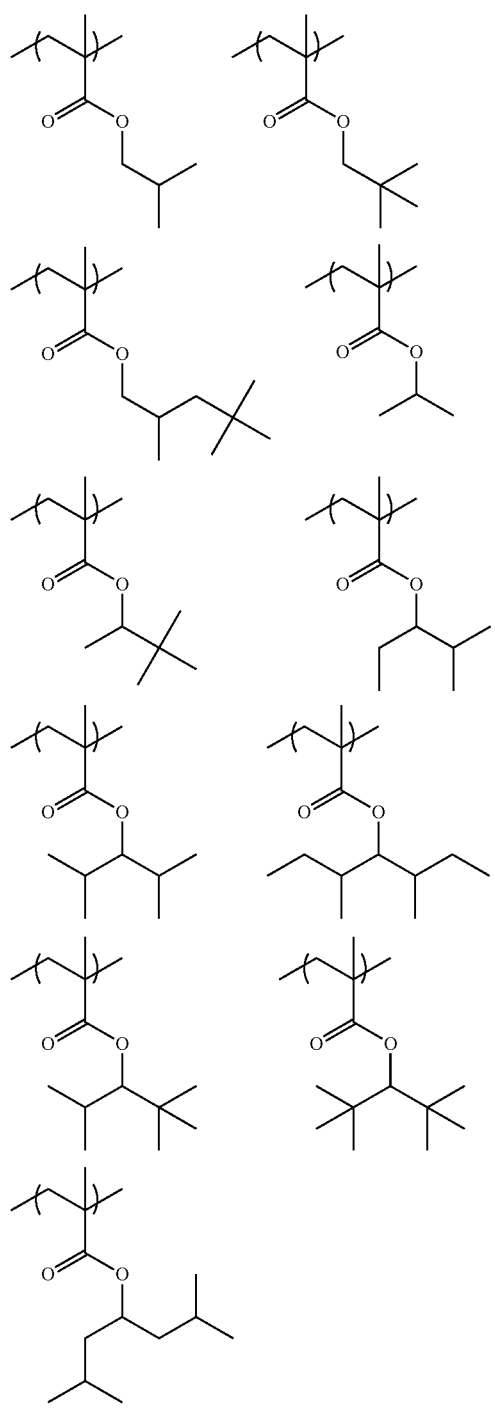
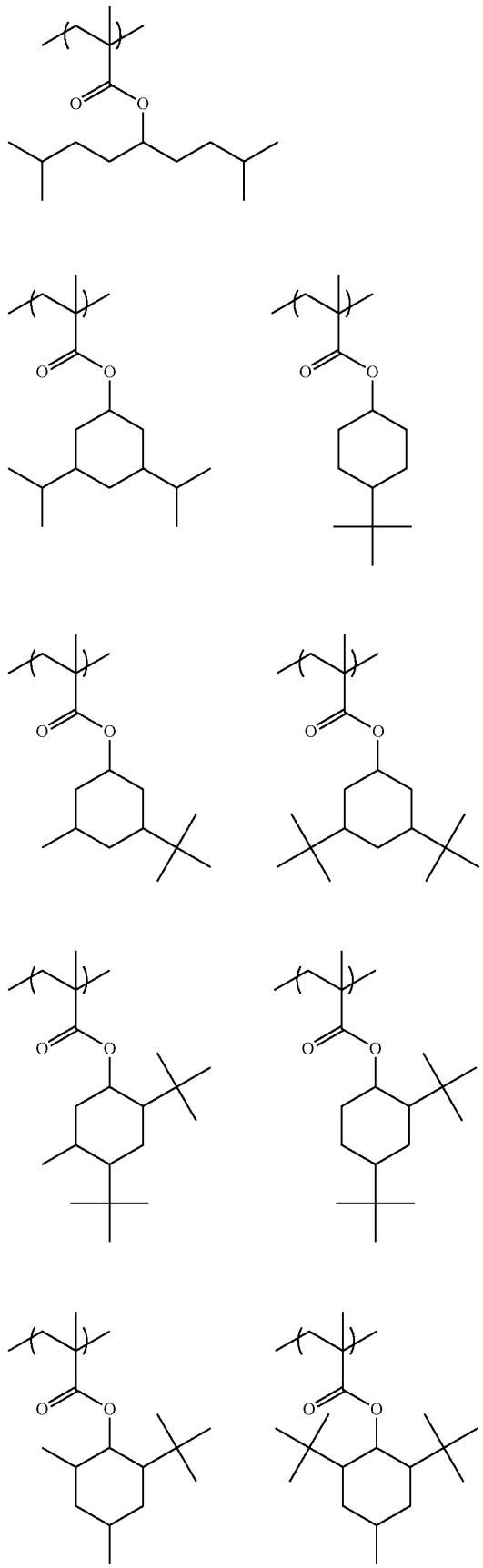

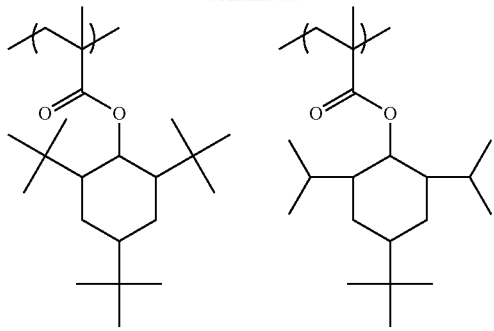

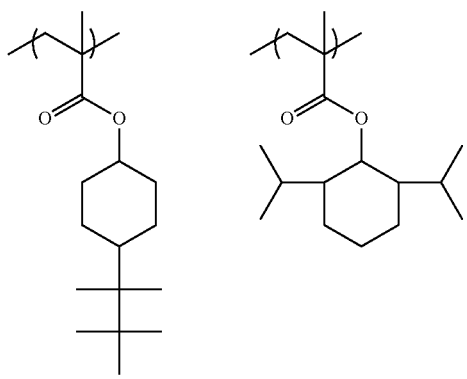

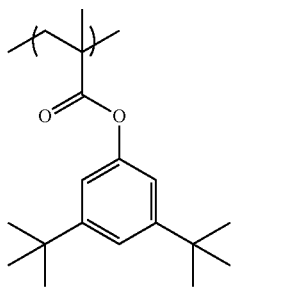

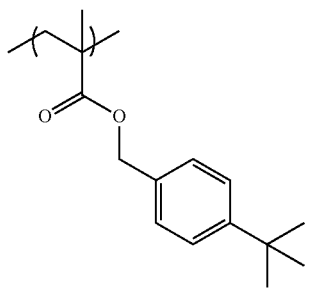

The repeating unit represented by General Formula (II) is preferably a repeating unit which is stable against an acid (acid-indecomposable), and specifically, it is preferably a repeating unit not having a group that decomposes by the action of an acid to generate a polar group.

Hereinafter, the repeating unit represented by General Formula (III) will be described in detail.

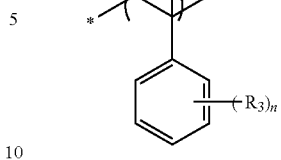

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the "acid-decomposable group" described with respect to the resin P.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, more preferably 1 to 3, and still more preferably 1 or 2.

Specific preferred examples of the repeating unit represented by General Formula (III) are shown below, but the present invention is not limited thereto.

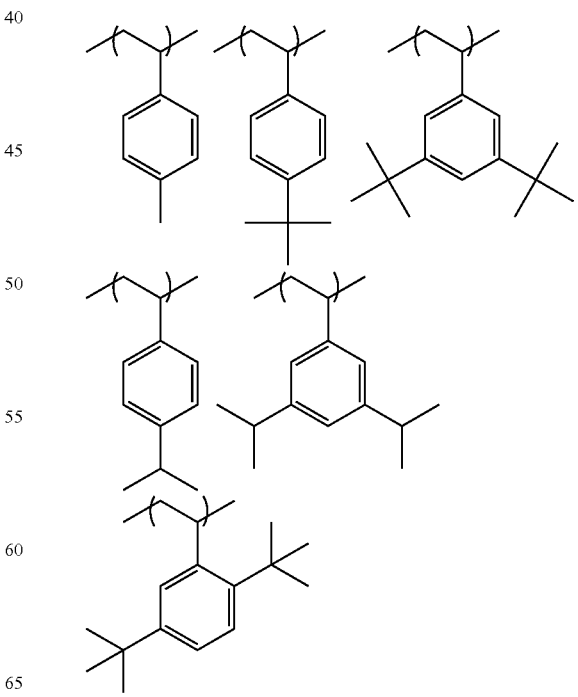

The repeating unit represented by General Formula (III) is preferably a repeating unit which is stable against an acid (acid-indecomposable), and specifically, it is preferably a repeating unit which does not have a group that decomposes by the action of an acid to generate a polar group.

In a case where the hydrophobic resin (D) includes a $CH_3$ partial structure in the side chain portion thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin (D). Further, the content is usually 100% by mole or less with respect to all the repeating units of the hydrophobic resin (D).

By incorporating at least one repeating unit (x) of the repeating unit represented by General Formula (II) or the repeating unit represented by General Formula (III) in a proportion of 90% by mole or more with respect to all the repeating units of the hydrophobic resin (D) into the hydrophobic resin (D), the surface free energy of the hydrophobic resin (D) is increased. As a result, is difficult for the hydrophobic resin (D) to be unevenly distributed on the surface of the resist film and the static/dynamic contact angle of the resist film with respect to water can be securely increased, thereby enhancing the immersion liquid tracking properties.

In addition, in a case where the hydrophobic resin (D) contains (i) a fluorine atom and/or a silicon atom or (ii) a $CH_3$ partial structure in the side chain moiety, the hydrophobic resin may have at least one group selected from the following groups (x) to (z):

(x) an acid group,
(y) a group having a lactone structure, an acid anhydride group, or an acid imido group, and
(z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating units containing an acid group (x) is preferably 1% to 50% by mole, more preferably 3% to 35% by mole, and still more preferably 5% to 20% by mole, with respect to all the repeating units in the hydrophobic resin (D).

Specific preferred examples of the repeating unit containing an acid group (x) are shown below, but the present invention is not limited thereto. In the formulae, Rx represents a hydrogen atom, $CH_3$, $CF_3$, or $CH_2OH$.

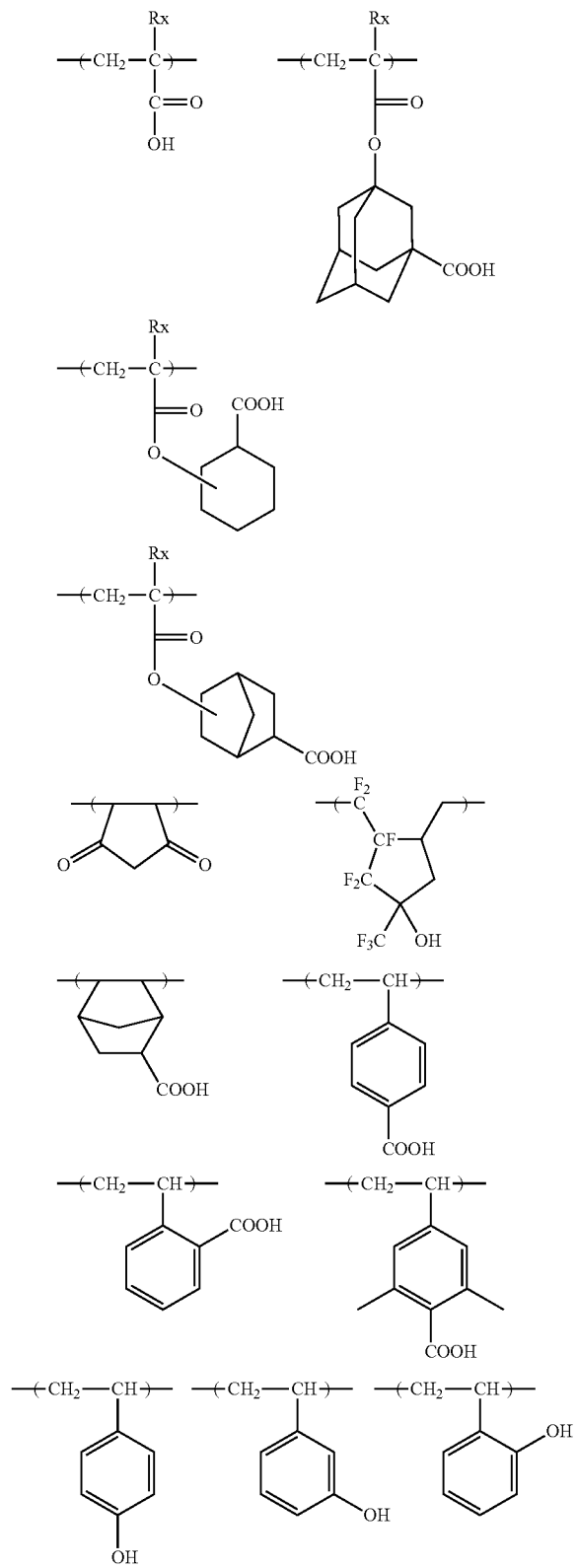

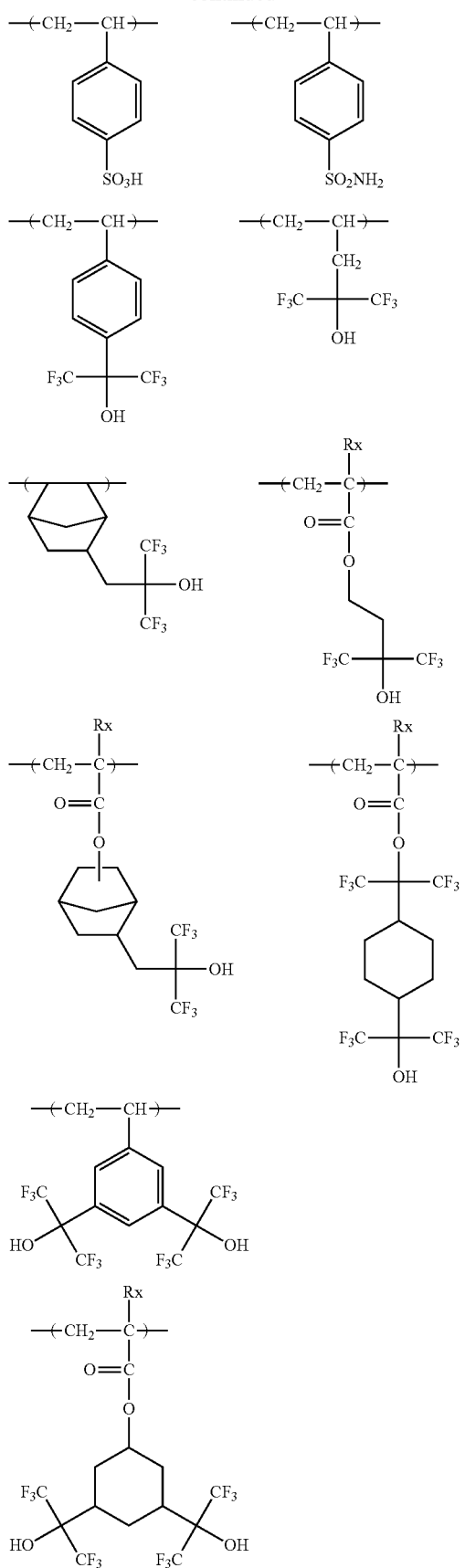
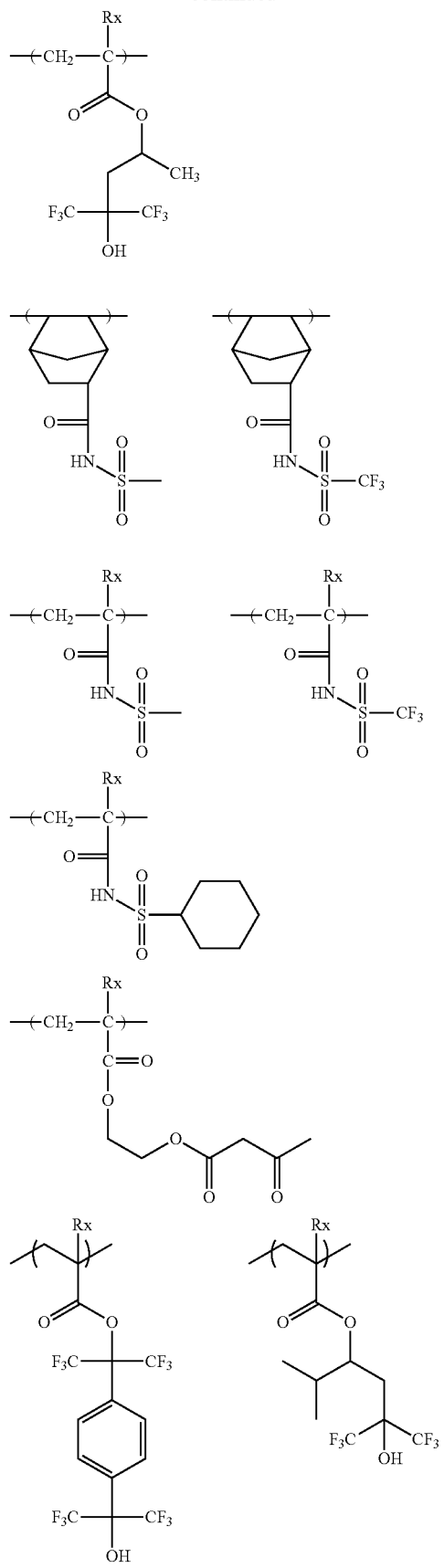

-continued

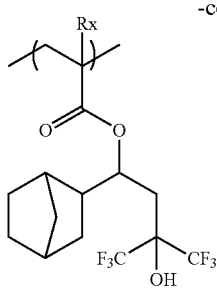

As the group having a lactone structure, the acid anhydride group, or the acid imido group (y), a group having a lactone structure is particularly preferable.

The repeating unit including such a group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin P.

The content of the repeating units having a group having a lactone structure, an acid anhydride group, or an acid imido group is preferably 1% to 100% by mole, more preferably 3% to 98% by mole, and still more preferably 5% to 95% by mole, with respect to all the repeating units in the hydrophobic resin (D).

With respect to the hydrophobic resin (D), examples of the repeating unit having a group (z) that decomposes by the action of an acid include the same ones as the repeating units having an acid-decomposable group, as mentioned with respect to the resin P. The repeating unit having a group (z) that decomposes by the action of an acid may have at least one of a fluorine atom or a silicon atom. With respect to the hydrophobic resin (D), the content of the repeating units having a group (z) that decomposes by the action of an acid is preferably 1% to 80% by mole, more preferably 10% to 80% by mole, and still more preferably 20% to 60% by mole, with respect to all the repeating units in the resin (D).

The hydrophobic resin (D) may further have repeating units different from the above-mentioned repeating units.

The content of the repeating units including a fluorine atom is preferably 10% to 100% by mole, and more preferably 30% to 100% by mole, with respect to all the repeating units included in the hydrophobic resin (D). Further, the content of the repeating units including a silicon atom is preferably 10% to 100% by mole, and more preferably 20% to 100% by mole, with respect to all the repeating units included in the hydrophobic resin (D).

On the other hand, in particular, in a case where the hydrophobic resin (D) includes a $CH_3$ partial structure in the side chain moiety thereof, it is also preferable that the hydrophobic resin (D) has a form not having substantially any one of a fluorine atom and a silicon atom. Further, it is preferable that the hydrophobic resin (D) is substantially composed of only repeating units, which are composed of only atoms selected from a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000, and more preferably 1,000 to 50,000.

Furthermore, the hydrophobic resins (D) may be used singly or in combination of plural kinds thereof.

The content of the hydrophobic resin (D) in the composition is preferably 0.01% to 10% by mass, and more preferably 0.05% to 8% by mass, with respect to the total solid content of the composition of the present invention.

In the hydrophobic resin (D), the content of residual monomers or oligomer components is also preferably 0.01% to 5% by mass, and more preferably 0.01% to 3% by mass. Further, the molecular weight distribution (Mw/Mn, also referred to as a dispersity) is preferably in the range of 1 to 5, and more preferably in the range of 1 to 3.

As the hydrophobic resin (D), various commercial products may also be used, or the resin may be synthesized by an ordinary method (for example, radical polymerization).

[4] Acid Diffusion Control Agent

The composition of the present invention preferably contains an acid diffusion control agent. The acid diffusion control agent acts as a quencher that inhibits a reaction of the acid-decomposable resin in the unexposed area by excessive generated acids by trapping the acids generated from an acid generator or the like upon exposure. As the acid diffusion control agent, a basic compound, a low molecular compound which has a nitrogen atom and a group that leaves by the action of an acid, a basic compound whose basicity is reduced or lost upon irradiation with active light or radiation, or an onium salt which becomes a relatively weak acid with respect to the acid generator upon irradiation with active light or radiation can be used.

Preferred examples of the basic compound include compounds having structures represented by the following Formulae (A) to (E).

(A)

(B)

(C)

(D)

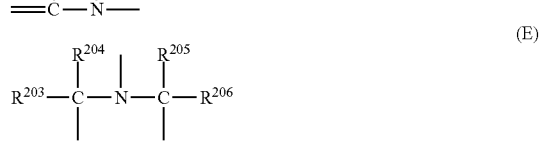

(E)

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R_{203}$, $R_{204}$, $R_{205}$, and $R^{206}$ may be the same as or different from each other, and each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in General Formulae (A) and (E) are more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in [0379] of US2012/0219913A1.

Preferred examples of the basic compound include an amine compound having a phenoxy group, an ammonium salt compound having a phenoxy group, an amine compound containing a sulfonic ester group, and an ammonium salt compound having a sulfonic ester group.

These basic compounds may be used singly or in combination of two or more kinds thereof.

The composition of the present invention may or may not contain the basic compound, but in a case where it contains the basic compound, the content of the basic compound is usually 0.001% to 10% by mass, and preferably 0.01% to 5% by mass, with respect to the solid content of the composition.

The ratio between the acid generator to the basic compound to be used in the composition, in terms of acid generator/basic compound (molar ratio), is preferably 2.5 to 300, more preferably 5.0 to 200, and still more preferably 7.0 to 150.

The low molecular compound (hereinafter referred to as a "compound (C)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (C) is preferably 100 to 1,000, more preferably 100 to 700, and particularly preferably 100 to 500.

The compound (C) may have a carbamate group having a protecting group on a nitrogen atom. The protecting group constituting the carbamate group can be represented by the following General Formula (d-1).

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, structures disclosed in [0466] of US2012/0135348A1.

It is particularly preferable that the compound (C) has a structure of the following General Formula (6).

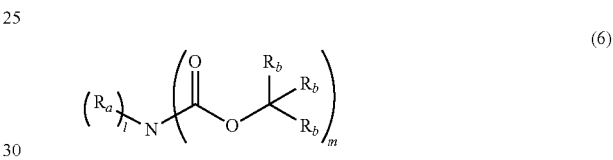

(6)

In General Formula (6), $R_a$ represents a hydrogen atom, an alkyl group, a cycloalkyl group, an aryl group, or an aralkyl group. When l is 2, two $R_a$'s may be the same as or different from each other. Two $R_a$'s may be linked to each other to form a heterocycle together with the nitrogen atom in the formula. The heterocycle may contain a heteroatom other than the nitrogen atom in the formula.

$R_b$ has the same meaning as $R_b$ in General Formula (d-1), and preferred examples are also the same.

l represents an integer of 0 to 2, and m represents an integer of 1 to 3, satisfying l+m 3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, a cycloalkyl group, an aryl group, and aralkyl group may be substituted with the groups as described above) of $R_a$ include the same groups as the specific of examples as described above with respect to $R_b$.

Specific examples of the particularly preferred compound (C) in the present invention include, but are not limited to, the compounds disclosed in [0475] of US2012/0135348A1.

The compounds represented by General Formula (6) can be synthesized in accordance with JP2007-298569A, JP2009-199021A, and the like.

In the present invention, the low molecular compound (C) having a group that leaves by the action of an acid on a nitrogen atom may be used singly or in combination of two or more kinds thereof.

The content of the compound (C) in the composition of the present invention is preferably 0.001% to 20% by mass, more preferably 0.001% to 10% by mass, and still more preferably 0.01% to 5% by mass, with respect to the total solid content of the composition.

The basic compound whose basicity is reduced or lost upon irradiation with active light or radiation (hereinafter also referred to as a "compound (PA)") is a compound which has a functional group with proton acceptor properties, and decomposes under irradiation with active light or radiation to exhibit deterioration in proton acceptor properties, no proton acceptor properties, or a change from the proton acceptor properties to acid properties.

The functional group with proton acceptor properties refers to a functional group having a group or an electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

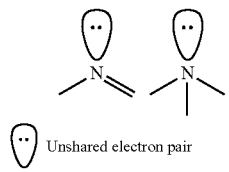

Preferred examples of the partial structure of the functional group with proton acceptor properties include crown ether, azacrown ether, primary to tertiary amines, pyridine, imidazole, and pyrazine structures.

The compound (PA) decomposes upon irradiation with active light or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement.

In the present invention, the acid dissociation constant pKa of the compound generated by the decomposition of the compound (PA) upon irradiation with active light or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Company, Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by the following General Formula (PA-1), for example, as the proton adduct generated by decomposition upon irradiation with active light or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

$$Q\text{-}A\text{-}(X)_n\text{—}B\text{—}R \qquad (PA\text{-}1)$$

In General Formula (PA-1),

Q represents —$SO_3H$, —$CO_2H$, or —$W_1NHW_2R_f$, in which $R_f$ represents an alkyl group (preferably having 1 to 20 carbon atoms), a cycloalkyl group (preferably having 3 to 20 carbon atoms), or an aryl group (preferably having 6 to 30 carbon atoms), and $W_1$ and $W_2$ each independently represent —SO— or —CO—.

A represents a single bond or a divalent linking group.

X represents —SO— or —CO—.

n is 0 or 1.

B represents a single bond, an oxygen atom, or —$N(R_x)R_y$—, in which $R_x$ represents a hydrogen atom or a monovalent organic group, and $R_y$ represents a single bond or a divalent organic group, provided that $R_x$ may be bonded to $R_y$ to form a ring or may be bonded to R to form a ring.

R represents a monovalent organic group having a functional group with proton acceptor properties.

General Formula (PA-1) will be described in more detail.

The divalent linking group in A is preferably an alkylene group having at least one fluorine atom, and more preferably perfluoroalkylene groups such as a perfluoroethylene group, a perfluoropropylene group, and a perfluorobutylene group.

Examples of the monovalent organic group in $R_x$ include an alkyl group, a cycloalkyl group, an aryl group, an aralkyl group, and an alkenyl group, and these groups may further have a substituent.

The alkyl group in $R_x$ is preferably a linear or branched alkyl group having 1 to 20 carbon atoms, and may have an oxygen atom, a sulfur atom, or a nitrogen atom in the alkyl chain.

The cycloalkyl group in $R_x$ is preferably a monocyclic or polycyclic cycloalkyl group having 3 to 20 carbon atoms, and may have an oxygen atom, a sulfur atom, or a nitrogen atom in the ring.

The aryl group in $R_x$ is preferably an aryl group having 6 to 14 carbon atoms, and examples thereof include a phenyl group and a naphthyl group.

The aralkyl group in $R_x$ is preferably an aralkyl group having 7 to 20 carbon atoms, and examples thereof include a benzyl group and a phenethyl group.

The alkenyl group in $R_x$ is preferably an alkenyl group having 3 to 20 carbon atoms, and examples thereof include a vinyl group, an allyl group, and a styryl group.

Preferred examples of the divalent organic group in $R_y$ include an alkylene group.

Examples of the ring structure which may be formed by the mutual bonding of $R_x$ and $R_y$ include 5- to 10-membered rings containing a nitrogen atom.

The functional group with proton acceptor properties in R is as described above.

The organic group having such a structure is preferably an organic group having 4 to 30 carbon atoms, and examples thereof include an alkyl group, a cycloalkyl group, an aryl group, an aralkyl group, and an alkenyl group.

The alkyl group and the like in the alkyl group, the cycloalkyl group, the aryl group, the aralkyl group, or the alkenyl group containing a functional group with proton acceptor properties or an ammonium group in R are the same as the alkyl group and the like as mentioned as $R_x$, respectively.

When B is $-N(R_x)R_y-$, it is preferable that R and $R_x$ are bonded to each other to form a ring. The number of carbon atoms which form a ring is preferably 4 to 20, the ring may be monocyclic or polycyclic, and an oxygen atom, and a sulfur atom, or a nitrogen atom may be included in the ring.

Examples of the monocyclic structure include 4- to 8-membered rings, each containing a nitrogen atom. Examples of the polycyclic structure include structures formed by a combination of two, or three or more monocyclic structures.

$R_f$ in $-W_1NHW_2R_f$ represented by Q is preferably a perfluoroalkyl group having 1 to 6 carbon atoms. Further, it is preferable that at least one of $W_1$ or $W_2$ is $-SO_2-$.

The compound (PA) is preferably an ionic compound. The functional group with proton acceptor properties may be contained in an anion moiety or a cation moiety, and it is preferable that the functional group is contained in an anion moiety.

Preferred examples of the compound (PA) include compounds represented by the following General Formulae (4) to (6).

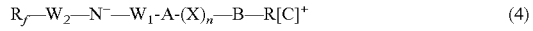 (4)

 (5)

 (6)

In General Formulae (4) to (6), A, X, n, B, R, $R_f$, $W_1$, and $W_2$ each have the same definitions as those, respectively, in General Formula (PA-1).

$C^+$ represents a counter cation.

The counter cation is preferably an onium cation. More specifically, preferred examples thereof include the sulfonium cations described as $S^+(R_{201})(R_{202})(R_{203})$ in General Formula (ZI) and the iodonium cations described as $I^+(R_{204})(R_{205})$ in General Formula (ZII) with regard to the acid generator.

Specific examples of the compound (PA) include the compounds exemplified in [0280] of US2011/0269072A1.

Furthermore, in the present invention, compounds (PA) other than a compound which generates the compound represented by General Formula (PA-1) can also be appropriately selected. For example, a compound containing a proton acceptor moiety at its cation moiety may be used as an ionic compound. More specific examples thereof include a compound represented by the following General Formula (7).

 (7)

In the formula, A represents a sulfur atom or an iodine atom.

m represents 1 or 2 and n represents 1 or 2, provided that m+n=3 when A is a sulfur atom and that m+n=2 when A is an iodine atom.

R represents an aryl group.

$R_N$ represents an aryl group substituted with the functional group with proton acceptor properties, and $X^-$ represents a counter anion.

Specific examples of $X^-$ include the same anions as those of the acid generators as described above.

Specific preferred examples of the aryl group of R and $R_N$ include a phenyl group.

Specific examples of the functional group with proton acceptor properties contained in $R_N$ are the same as those of the functional group with proton acceptor properties as described above in Formula (PA-1).

Specific examples of the ionic compounds having a proton acceptor site at a cationic moiety include the compounds exemplified in [0291] of US2011/0269072A1.

Furthermore, such compounds can be synthesized, for example, with reference to the methods described in JP2007-230913A, JP2009-122623A, and the like.

The compound (PA) may be used singly or in combination of two or more kinds thereof.

The content of the compound (PA) is preferably 0.1% to 10% by mass, and more preferably 1% to 8% by mass, with respect to the total solid content of the composition.

In the composition of the present invention, an onium salt which becomes a relatively weak acid with respect to the acid generator can be used as an acid diffusion control agent.

In a case of mixing the acid generator and the onium salt that generates an acid which is a relatively weak acid with respect to an acid generated from the acid generator, and then using the mixture, when the acid generated from the acid generator upon irradiation with active light or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by the following General Formulae (d1-1) to (d1-3) are preferable.

 (d1-1)

 (d1-2)

 (d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group containing a fluorine atom, and M⁺'s are each independently a sulfonium or iodonium cation.

Preferred examples of the sulfonium cation or the iodonium cation represented by M⁺ include the sulfonium cations exemplified by General Formula (ZI) and the iodonium cations exemplified by General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (CA)") having a cationic moiety and an anionic moiety in the same molecule, in which the cationic moiety and the anionic moiety are linked to each other through a covalent bond.

As the compound (CA), a compound represented by any one of the following General Formulae (C-1) to (C-3) is preferable.

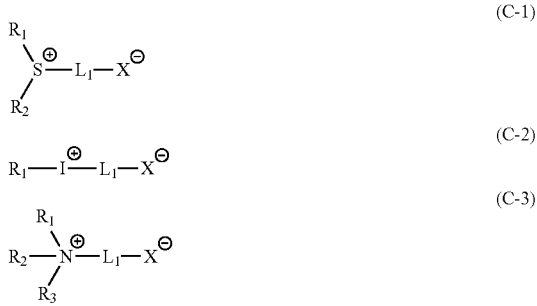

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—X⁻ represents an anionic moiety selected from —COO⁻, —SO₃⁻, —SO₂⁻, and —N⁻—R₄. $R_4$ represents a monovalent substituent having a carbonyl group: —C(=O)—, a sulfonyl group: —S(=O)₂—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably alkylene group, an arylene group, an ether bond, ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] to [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the acid generator is preferably 0.5% to 10.0% by mass, more preferably 0.5% to 8.0% by mass, and still more preferably 1.0% to 8.0% by mass, with respect to the solid content of the composition.

[5] Solvent

The composition of the present invention usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include ones described in, for example, [0441] to [0455] in the specification of US2008/0187860A.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the aforementioned exemplary compounds can be appropriately selected and used, but as the solvent containing a hydroxyl group, an alkylene glycol monoalkyl ether, alkyl lactate, and the like are preferable, and propylene glycol monomethyl ether (PGME, alternative name: 1-methoxy-2-propanol), methyl 2-hydroxyisobutyrate, and ethyl lactate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are particularly preferable, and propylene glycol monomethyl ether acetate, ethyl ethoxypropionate, and 2-heptanone are most preferable.

The mixing ratio (based on mass) of the solvent containing a hydroxyl group and the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent preferably contains propylene glycol monomethyl ether acetate, and is more preferably a solvent composed of propylene glycol monomethyl ether acetate singly or a mixed solvent of two or more kinds of solvents including propylene glycol monomethyl ether acetate.

[6] Surfactant

The composition of the present invention may or may not further contain a surfactant.

In a case where the composition contains the surfactant, it more preferably contains any one of fluorine-based and/or silicon-based surfactants (a fluorine-based surfactant, a silicon-based surfactant, and a surfactant having both a fluorine atom and a silicon atom), or two or more kinds thereof.

By incorporating the surfactant into the composition of the present invention, it becomes possible to provide a resist pattern having improved adhesiveness and decreased development defects with good sensitivity and resolution when an exposure light source of 250 nm or less, and particularly 220 nm or less, is used.

Examples of the fluorine-based and/or silicon-based surfactants include the surfactants described in paragraph [0276] in the specification of US2008/0248425A.

In addition, in the present invention, surfactants other than the fluorine-based and/or silicon-based surfactants described in paragraph [0280] in the specification of US2008/0248425A can also be used.

These surfactants may be used singly or n combination of a few surfactants.

In a case where the composition of the present invention contains a surfactant, the amount of the surfactant to be used is preferably 0.0001% to 2% by mass, and more preferably 0.0005% to 1% by mass, with respect to the total solid content of the composition.

On the other hand, by setting the amount of the surfactant to be added to 10 ppm or less with respect to the total amount (excluding the solvent) of the composition, the hydrophobic resin is more unevenly distributed to the surface, so that the resist film surface can be made more hydrophobic, which can enhance the water tracking properties during the liquid immersion exposure.

[7] Other Additives

The composition of the present invention may or may not contain an onium carboxylate salt. Examples of such an onium carboxylate salt include those described in [0605] to [0606] in the specification of US2008/0187860A.

The onium carboxylate salt can be synthesized by reacting sulfonium hydroxide, iodonium hydroxide, ammonium hydroxide and carboxylic acid with silver oxide in a suitable solvent.

In the case where the composition of the present invention contains the onium carboxylate salt, the content of the salt is generally 0.1% to 20% by mass, preferably 0.5% to 10% by mass, and more preferably 1% to 7% by mass, with respect to the total solid content of the composition.

The composition of the present invention may further contain an acid amplifier, a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic or aliphatic compound having a carboxyl group), and the like, if desired.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), US4916210A, EP219294B, and the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

The composition of the present invention is preferably a resist film having a film thickness of 80 nm or less from the viewpoint of improving the resolving power. It is possible to set the film thickness by setting the concentration of the solid content in the composition to an appropriate range, thus to have a suitable viscosity and improve a coating property and a film forming property.

The concentration of the solid content of the composition according to the present invention is usually 1.0% to 10% by mass, preferably 2.0% to 5.7% by mass, and more preferably 2.0% to 5.3% by mass. By setting the concentration of the solid content to these ranges, it is possible to uniformly coat the resist solution on a substrate and additionally, it is possible to form a resist pattern having excellent line width roughness. The reason is not clear; however, it is considered that, by setting the concentration of the solid content to 10% by mass or less, and preferably 5.7% by mass or less, the aggregation of materials, particularly the photoacid generator, in the resist solution is suppressed and, as the result, it is possible to form a uniform resist film.

The concentration of the solid content is the weight percentage of the weight of other resist components excluding the solvent with respect to the total weight of the composition.

The composition of the present invention is used by dissolving the components in a predetermined organic solvent, and preferably in the mixed solvent, filtering the solution through a filter, and then applying the filtered solution on a predetermined support (substrate). The filter for use in filtration is preferably a polytetrafluoroethylene-, polyethylene- or nylon-made filter having a pore size of 0.1 µm or less, more preferably 0.05 µm or less, and still more preferably 0.03 µm or less. In the filtration through a filter, as described in, for example, JP2002-62667A, circulating filtration may be carried out, or the filtration may be carried out by connecting plural kinds of filters in series or in parallel. In addition, the composition may be filtered a plurality of times. Furthermore, the composition may be subjected to a deaeration treatment or the like before or after filtration through a filter.

The composition of the present invention is related to an active-light-sensitive or radiation-sensitive resin composition whose properties change by undergoing a reaction upon irradiation with active light or radiation. More specifically, the present invention relates to an active-light-sensitive or radiation-sensitive resin composition which can be used in for a step of manufacturing a semiconductor such as an IC, for manufacture of a circuit board for a liquid crystal, a thermal head, or the like, the manufacture of a mold structure for imprinting, or a other photofabrication processes, or used in a planographic printing plate or an acid-curable composition.

[8] Pattern Forming Method

Next, the pattern forming method according to the present invention will be described.

The pattern forming method of the present invention includes at least the following steps:

(i) a step of forming a film (an active-light-sensitive or radiation-sensitive resin composition film, a composition film, or a resist film) on a substrate, using the composition of the present invention, (ii) a step of irradiating (exposing) the film with active light or radiation (exposing step), and (iii) a step of developing the film irradiated with active light or radiation, using a developer (developing step).

The exposure in the step (ii) may be liquid immersion exposure.

The pattern forming method of the present invention may include (iv) a heating step after (ii) the exposing step.

The pattern forming method of the present invention may include (ii) the exposing step in plural times.

The pattern forming method of the present invention may include (iv) the heating step in plural times.

The resist film of the present invention is a film formed from the aforementioned composition of the present invention, and more specifically, it is preferably a film formed by applying the composition onto a substrate. In the pattern forming method of the present invention, the step of forming a film from the composition on a substrate, the step of exposing the film, and the developing step can be carried out by a generally known method.

The substrate on which the film is formed in the present invention is not particularly limited, and an inorganic substrate such as silicon, $SiO_2$, and SiN, a coating type inorganic substrate such as SOG, or a substrate generally used in a process for manufacturing a semiconductor such as an IC, in a process for manufacture of a circuit board for a liquid crystal, a thermal head, or the like, and in other lithographic processes of photofabrication can be used. If desired, an antireflection film may further be formed between the resist film and the substrate. As the antireflection film, a known organic or inorganic antireflection film can be appropriately used.

It is also preferable that the method includes a pre-heating step (PB; Prebake) after forming a film and before the exposing step.

Moreover, it is also preferable that the method includes a step of heating after exposure (PEB: Post Exposure Bake) after the exposing step and before the developing step.

For both of PB and PEB, the heating is preferably carried out at a heating temperature of 70° C. to 130° C., and more preferably 80° C. to 120° C.

The heating time is preferably 30 to 300 seconds, more preferably 30 to 180 seconds, and still more preferably 30 to 90 seconds.

Heating may be carried out using a means installed in an ordinary exposure or development machine, or may also be carried out using a hot plate or the like.

The baking accelerates the reaction in the exposed areas, and thus, the sensitivity or the pattern profile is enhanced.

The light source wavelength used in the exposure device in the present invention is not particularly limited, and examples thereof include infrared rays, visible light, ultraviolet rays, far ultraviolet rays, extreme ultraviolet rays, X-rays, and electron beams, for example, far ultraviolet rays at a wavelength of preferably 250 nm or less, more preferably 220 nm or less, and particularly preferably 1 to 200 nm, specifically a KrF excimer laser (248 nm), an ArF excimer laser (193 nm), an $F_2$ excimer laser (157 nm), X-rays, EUV (13 nm), electron beams, and the like, with the KrF excimer laser, the ArF excimer laser, EUV, or the electron beams being preferable, and the ArF excimer laser being more preferable.

Furthermore, a liquid immersion exposure method can be applied to the step of carrying out exposure of the present invention. It is possible to combine the liquid immersion exposure method with super-resolution technology such as a phase shift method and a modified illumination method. The liquid immersion exposure can be carried out by the method described in, for example, paragraphs [0594] to [0601] of JP2013-242397A.

Moreover, if the receding contact angle of the resist film formed using the composition in the present invention is extremely small, the resist film cannot be suitably used in a case of carrying out the exposure through a liquid immersion medium. Further, the effect of reducing watermark defect cannot be sufficiently exhibited. In order to realize a favorable receding contact angle, it is preferable to incorporate the hydrophobic resin (D) into the composition. Alternatively, a film (hereinafter also referred to as a "top coat") sparingly soluble in an immersion liquid, which is formed of the hydrophobic resin (D), may be formed on the upper layer of the resist film. The functions required for the top coat are coating suitability on the upper layer part of a resist film, and sparing solubility in an immersion liquid. It is preferable that the top coat is not mixed with the composition film and can be uniformly applied onto the upper layer of a composition film.

The top coat is not particularly limited, and top coats known in the related art can be formed according to the methods known in the related art, and can be formed, for example, according to the description in paragraphs [0072] to [0082] of JP2014-059543A.

In a case where a developer containing an organic solvent is used in the developing, step which will be described later, it is preferable that a top coat containing the basic compound described in JP2013-61648A is formed on a resist film.

In addition, even in a case where exposure is carried out by a method other than a liquid immersion exposure method, a top coat may be formed on a resist film.

In the liquid immersion exposure step, it is necessary for the immersion liquid to move on a wafer following the movement of an exposure head which scans the wafer at a high speed to form an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

The developer used in the step of developing the active-light-sensitive or radiation-sensitive resin composition film formed using the composition of the present invention is not particularly limited, but an alkali developer or a developer containing an organic solvent (hereinafter also referred to as an organic developer), for example, can be used.

The alkali developer is not particularly limited, and examples thereof include the alkali developers described in paragraph [0460] of JP2014-048500A.

As a rinsing liquid in the rinsing treatment to be carried out after the alkali development, pure water is used, and an appropriate amount of a surfactant may also be added and used.

Incidentally, after the development treatment or the rinsing treatment, a treatment for removing the developer or the rinsing liquid adhering on the pattern by a supercritical fluid may be carried out.

As the organic developer, a polar solvent such as a ketone-based solvent, an ester-based solvent, an alcohol-based solvent, an amide-based solvent, and an ether-based solvent, or a hydrocarbon-based solvent can be used, and specific examples thereof include the solvents described in paragraphs [0461] to [0463] of JP2014-048500A. As the organic developer, butyl butyrate and methyl 2-hydroxyisobutyrate may be used.

The above solvents can be used by mixing a plurality of the solvents or by mixing the solvent with water or solvents other than the solvents. However, in order to sufficiently exhibit the effects of the present invention, the moisture content in the entire developer is preferably less than 10% by mass, but a developer having substantially no water is more preferable.

That is, the amount of the organic solvent to be used with respect to the organic developer is preferably from 90% by mass to 100% by mass, and more preferably from 95% by mass to 100% by mass, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, the evaporation of the developer on the substrate or in a developing cup is inhibited, the temperature uniformity in the wafer surface is improved, and as a result, the dimensional uniformity within a wafer surface is improved.

It is possible to add an appropriate amount of a surfactant to the organic developer, if necessary.

The surfactant is not particularly limited, but it is possible to use, for example, ionic or non-ionic fluorine-based and/or silicon-based surfactants, or the like. Examples of the fluorine-based and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), US5405720A, US5360692A, US5529881A, US5296330A, US5436098A, US5576143A, US5294511A, and US5824451A, and non-ionic surfactants are preferable. The non-ionic surfactant is not particularly limited, but it is more preferable to use a fluorine-based surfactant or a silicon-based surfactant.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include the same ones as for the basic compound which can be included in the aforementioned composition as the acid diffusion control agent.

As the developing method, for example, a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied. Further, suitable ranges of the discharge pressure of the developer to be discharged, methods for adjusting the discharge pressure of the developer, and the like are not particularly limited, and for example, the ranges and the methods described in paragraphs [0631] to [0636] of JP2013-242397A can be used.

In the pattern forming method of the present invention, a step of performing development by using a developer containing an organic solvent (organic solvent developing step) and a step of carrying out development by using an aqueous alkali-solution (alkali developing step) may be used in combination. Due to this combination, a finer pattern can be formed.

In the present invention, an area with a low exposure intensity is removed in the organic solvent developing step, and by further carrying out the alkali developing step, an area with a high exposure intensity is also removed. By virtue of a multiple development process in which development is carried out a plurality of times in this way, a pattern can be formed by keeping only a region with an intermediate exposure intensity from being dissolved, so that a finer pattern than usual can be formed (the same mechanism as in [0077] of JP2008-292975A).

In the pattern forming method of the present invention, the order of the alkali developing step and the organic solvent developing step is not particularly limited, but the alkali development is more preferably carried out before the organic solvent developing step.

It is preferable that the method includes a step of rinsing using a rinsing liquid after the step of carrying out development using a developer including an organic solvent.

The rinsing liquid used in the rinsing step after the step of carrying out development using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described for the developer containing an organic solvent.

After the developing step using a developer including an organic solvent, it is more preferable to carry out a step of cleaning using a rinsing liquid containing at least one organic solvent selected from the group consisting of a ketone-based solvent, an ester-based solvent, an alcohol-based solvent, and an amide-based solvent, it is still more preferable to carry out a step of cleaning using a rinsing liquid containing an alcohol-based solvent or an ester-based solvent, it is particularly preferable to carry out a step of cleaning using a rinsing liquid containing a monohydric alcohol, and it is most preferable to carry out a step of cleaning using a rinsing liquid containing a monohydric alcohol having 5 or more carbon atoms.

Here, examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. Further, 1-hexanol, 2-hexanol, 4-methyl-2-pentanol, 1-pentanol, 3-methyl-1-butanol, or the like can be used as a particularly preferred monohydric alcohol having 5 or more carbon atoms.

The respective components in plural numbers may be mixed, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure at 20° C. of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a range from 0.05 kPa to 5 kPa, the temperature uniformity within a wafer surface is improved, and further, the dimensional uniformity within a wafer surface is enhanced by suppression of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a rotation application method), a method in which a substrate is immersed in a bath filled with a rinsing liquid for a certain period of time (a dip method), a method in which a rinsing liquid is sprayed on a substrate surface (a spray method), or the like, can be applied. Among these, a method in which a cleaning treatment is carried out using the rotation application method, and a substrate is rotated at a rotation speed of 2,000 rpm to 4,000 rpm after cleaning, thereby removing the rinsing liquid from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

It is preferable that various materials (for example, a developer, a rinsing liquid, a composition for forming an antireflection film, and a composition for forming a top coat) used in the active-light-sensitive or radiation-sensitive resin composition of the present invention and the pattern forming method of the present invention do not include impurities such as metals. The content of the metal components included in these materials is preferably 10 ppm or less, more preferably 5 ppm or less, and still more preferably 1 ppm or less, but the material not having substantially metal components (within a detection limit of a measurement device or less) is particularly preferable.

Examples of a method for removing impurities such as metals from the various materials include filtration using a filter. As for the filter pore diameter, the pore size is preferably 50 nm or less, more preferably 10 nm or less, and still more preferably 5 nm or less. As for the materials of a filter, a polytetrafluoroethylene-made filter, a polyethylene-made filter, and a nylon-made filter are preferable. In the step of filtration using a filter, plural kinds of filters may be connected in series or in parallel, and used. In the case of using plural kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials and subjecting raw materials constituting various materials to filtration using a filter. In the preferred conditions for filtration using a filter, performed for raw materials constituting various materials are the same as described above.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

Moreover, the present invention also relates to a method for manufacturing an electronic device, including the pattern forming method of the present invention as described above, and an electronic device manufactured by the manufacturing method.

The electronic device of the present invention is suitably mounted on electric or electronic equipment (home electronics, OA and media-related equipment, optical equipment, telecommunication equipment, and the like).

EXAMPLES

Hereinafter, the present invention will be described with reference to Examples, but the present invention is not limited thereto.

Synthesis Example 1: Synthesis of Resin B-1

84 parts by mass of cyclohexanone was heated at 80° C. under a nitrogen stream. While stirring this liquid, a mixed solution of 17.8 parts by mass of a monomer represented by the following structural formula M-1, 11.8 parts by mass of a monomer represented by the following structural formula M-2, 12.6 parts by mass of a monomer represented by the following structural formula M-3, 155 parts by mass of cyclohexanone, and 1.84 parts by mass of dimethyl 2,2'-azobisisobutyrate [V-601, manufactured by Wako Pure Chemical Industries, Ltd.] was added dropwise to the liquid for 6 hours. After completion of the dropwise addition, the mixture was further stirred at 80° C. for 2 hours. After being left to be cooled, the reaction liquid was reprecipitated with a large amount of methanol/water (mass ratio of 9:1) and filtered, and the obtained solid was dried in vacuo to obtain 38 parts by mass of the following resin B-1.

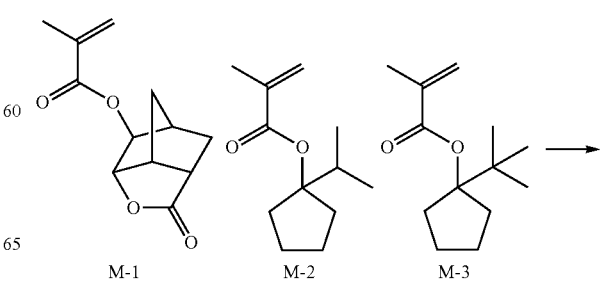

-continued

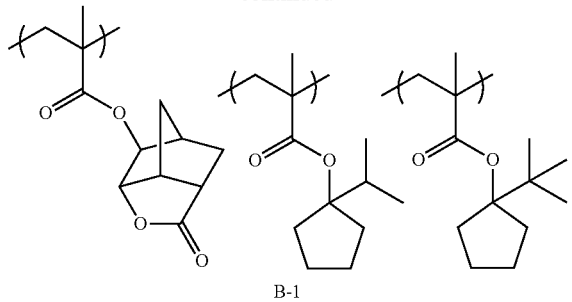

B-1

The weight-average molecular weight (Mw: in terms of polystyrene) of the obtained resin B-1, as determined by GPC (carrier: tetrahydrofuran (THF)), was as follows: Mw=9,000, and the dispersity was as follows: Mw/Mn=1.65. The compositional ratio (molar ratio; corresponding to the repeating units in order from the left side) measured by $^{13}$C-NMR was 40/30/30.

Furthermore, by carrying out the same operation as in Synthesis Example 1, the resins B-2 to B-12 described below which are the resin P were synthesized.

<Preparation of Resist Composition>

The components shown in Table 1 below were dissolved in the solvents shown in the same table to prepare solutions having a concentration of the solid content of 4% by mass, respectively, and these solutions were filtered through a polyethylene filter having a pore size of 0.05 μm to prepare resist compositions (resist compositions of Examples and Comparative Examples).

Furthermore, in Table 1 below, with respect to the acid generators, the numerical values in parentheses represent blend amounts (g). Incidentally, in all of Examples and Comparative Examples, the blend amounts of the resins are each 10 g. Further, with respect to the basic compounds, the numerical values in parentheses represent blend amounts (g). Further, with respect to the hydrophobic resins, the numerical values in parentheses represent blend amounts (g). In addition, with respect to the solvents, the numerical values represent mass ratios. Incidentally, in all of Examples and Comparative Examples each containing a surfactant, the blend amount of the surfactant is 10 mg.

<Evaluation>

(Pattern Formation: ArF Liquid Immersion Exposure 1)

An organic antireflection film, ARC29SR (manufactured by Nissan Chemical Industries, Ltd.), was applied onto a silicon wafer and baked at 205° C. for 60 seconds to form an antireflection film having a film thickness of 95 nm. The obtained resist composition was applied thereonto and baked (PB: Prebake) at 100° C. for 60 seconds to form a resist film having a film thickness of 100 nm. Moreover, on the resist film of Example 12, a top coat layer having a thickness of 300 Å was formed using a resin composition for forming a top coat (the concentration of the solid content of 3.0% by mass) in which a hydrophobic resin (5b) was dissolved in 4-methyl-2-pentanol.

The obtained wafer was exposed through a 6% halftone mask having a pitch of 136 nm and a light shielding area of 50 nm, using an ArF excimer laser liquid immersion scanner (manufactured by ASML; XT1700i, NA1.20, C-Quad, outer sigma 0.880, inner sigma 0.790, and XY polarization). Ultrapure water was used as an immersion liquid. Thereafter, the wafer was heated (PEB: Post Exposure Bake) at 85° C. for 60 seconds. Then, the wafer was developed by paddling it with a negative type developer (butyl acetate) for 30 seconds, and paddled and rinsed with a rinsing liquid [methylisobutyl carbinol (MIBC)] for 30 seconds. Then, the wafer was spun at a rotation speed of 4,000 rpm for 30 seconds to form a line-and-space pattern having a pitch of 136 nm and a space width of 35 nm.

(Pattern Formation: ArF Liquid Immersion Exposure 2)

An organic antireflection film, ARC29SR (manufactured by Nissan Chemical Industries, Ltd.), was applied onto a silicon wafer and baked at 205° C. for 60 seconds to form an antireflection film having a film thickness of 95 nm. The obtained resist composition was applied thereonto and baked (PB: Prebake) at 100° C. for 60 seconds to form a resist film having a film thickness of 100 nm. Moreover, on the resist film of Example 12, a top coat layer having a thickness of 300 Å was formed using a resin composition for forming a top coat (the concentration of the solid content of 3.0% by mass) in which a hydrophobic resin (5b) was dissolved in 4-methyl-2-pentanol.

The obtained wafer was exposed through a 6% halftone mask with a 1:1 line-and-space pattern having a line width of 48 nm, using an ArF excimer laser liquid immersion scanner (manufactured by ASML; XT1700i, NA1.20, C-Quad, outer sigma 0.900, inner sigma 0.812, and XY deflection). Ultrapure water was used as an immersion liquid. Thereafter, the wafer was heated (PEB: Post Exposure Bake) at 105° C. for 60 seconds. Then, the wafer was developed by paddling it with butyl acetate for 30 seconds, and paddled and rinsed with a rinsing liquid [methylisobutyl carbinol (MIBC)] for 30 seconds. Then, the wafer was spun at a rotation speed of 4,000 rpm for 30 seconds to form a 1:1 line-and-space pattern having a line width of 48 nm.

(Evaluation of Depth of Focus (DOF))

At a exposure dose for forming a line-and-space pattern having a pitch of 136 nm and a space width of 35 nm under the exposure and development conditions in Pattern Formation (ArF Liquid Immersion Exposure 1) above, exposure and development were carried out by changing the conditions of the exposure focus at an interval of 10 nm in the focus direction, the space line width (CD) of each of the obtained patterns was measured using a line-width length-measuring dimension scanning electron microscope SEM (S-9380, Hitachi, Ltd.), and a focus corresponding to the minimum value or the maximum value in a curve obtained by plotting the respective CDs was defined as a best focus. When the focus was changed while being centered on the best focus, a variation width of the focus with which a line width of 35 nm±10% was allowable, that is, a depth of focus (DOF) (nm) was calculated. The results are shown in Table 1 (DOF). Higher the depth of focus is more preferable.

(Evaluation of LWR (Line Width Roughness))

The line pattern with a 1:1 line-and-space pattern (line width of 48 nm) obtained under the exposure and development conditions in Pattern Formation (ArF Liquid Immersion Exposure 2) above was observed using a line-width length-measuring dimension scanning electron microscope SEM (S-9380, Hitachi, Ltd.), line widths were measured at 50 points within 1 μm of edge in the longitudinal direction of the line pattern, and the standard deviation of the measured variation was determined, and 3σ (nm) was computed therefrom. The results are shown in Table 1 (LWR). Lower LWR is more preferable.

TABLE 1

| | Acid generator (g) | Resin (10 g) | Basic compound (g) | Hydrophobic resin (g) | Solvent (Mass ratio) | Surfactant (10 mg) | Evaluation item 1 DOF (nm) | Evaluation item 2 LWR (nm) |
|---|---|---|---|---|---|---|---|---|
| Example 1 | A-1(1.4) | B-6 | C-1(0.76) | 4b(0.5) | A1/B1 = 90/10 | None | 125 | 4.0 |
| Example 2 | A-3(1.5) | B-7 | C-7(0.34) | 3b(0.3) | A1/B1 = 90/10 | None | 125 | 4.1 |
| Example 3 | A-10(1.4) | B-4 | C-4(0.42) | 1b(0.2) | A1/A2 = 70/30 | None | 110 | 4.2 |
| Example 4 | A-5(2.0) | B-9 | C-2(0.80) | 2b(0.4) | A1/B1 = 90/10 | None | 125 | 4.0 |
| Example 5 | A-8(1.9) | B-10 | C-5(0.33) | 1b(0.2) | A1/A2 = 70/30 | None | 115 | 4.5 |
| Example 6 | A-4(1.4) | B-8 | C-8(0.50) | 4b(0.5) | A1 | None | 125 | 3.9 |
| Example 7 | A-2(1.5) | B-1 | C-5(0.33) | 2b(0.4) | A1/B2 = 80/20 | None | 110 | 4.2 |
| Example 8 | A-2(0.2)/A-5(1.5) | B-7 | C-1(0.76) | 4b(0.5) | A1/B1 = 90/10 | None | 125 | 4.1 |
| Example 9 | A-1(1.4) | B-7 | C-2(0.80) | 4b(0.5) | A1/B1 = 90/10 | None | 125 | 4.1 |
| Example 10 | A-1(1.4) | B-7 | C-1(0.76) | 1b(0.2) | A1/B1 = 90/10 | None | 125 | 4.0 |
| Example 11 | A-1(1.4) | B-7 | C-1(0.76) | 4b(0.5) | A1/A2 = 70/30 | None | 125 | 4.0 |
| Example 12 | A-1(1.4) | B-7 | C-1(0.76) | 4b(0.5) | A1/B1 = 90/10 | W-2 | 125 | 4.0 |
| Example 13 | A-2(1.5) | B-3 | C-1(0.76) | 5b(0.4) | A1/A3 = 95/5 | None | 110 | 4.3 |
| Example 14 | A-3(0.5)/A-6(1.2) | B-5 | C-9(0.45) | 5b(0.4) | A1 | None | 110 | 4.2 |
| Example 15 | A-7(1.4) | B-2 | C-2(0.40)/C-6(0.21) | 1b(0.2) | A1/A2 = 80/20 | W-1 | 110 | 4.3 |
| Example 16 | A-9(1.5) | B-11 | C-3(0.32) | 1b(0.2) | A1/A2 = 70/30 | None | 105 | 4.5 |
| Example 17 | A-10(1.4) | B-12 | C-4(0.42) | 1b(0.2) | A1/A2 = 70/30 | None | 105 | 4.6 |
| Comparative Example 1 | A-2(1.5) | B-13 | C-2(0.80) | 1b(0.2) | A1 | W-1 | 80 | 4.9 |
| Comparative Example 2 | A-10(1.4) | B-14 | C-2(0.40)/C-6(0.21) | 2b(0.4) | A1/A3 = 95/5 | None | 65 | 4.9 |
| Comparative Example 3 | A-1(1.4) | B-15 | C-1(0.76) | 4b(0.5) | A1/B1 = 90/10 | None | 80 | 5.4 |
| Comparative Example 4 | A-1(1.4) | B-16 | C-1(0.76) | 4b(0.5) | A1/B1 = 90/10 | None | 65 | 5.2 |
| Comparative Example 5 | A-3(1.5) | B-17 | C-5(0.33) | 5b(0.4) | A1/B2 = 80/20 | W-2 | 65 | 4.7 |

In Table 1, the structures of the acid generator are as follows.

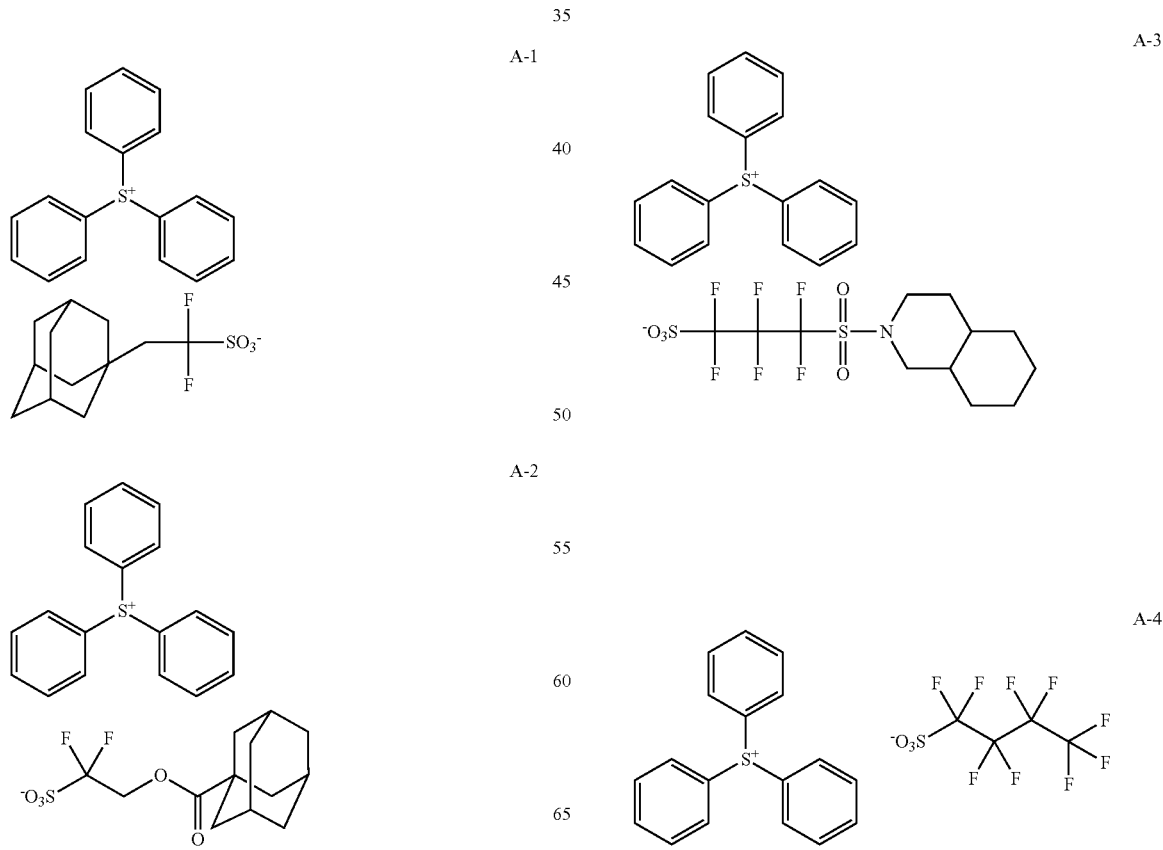

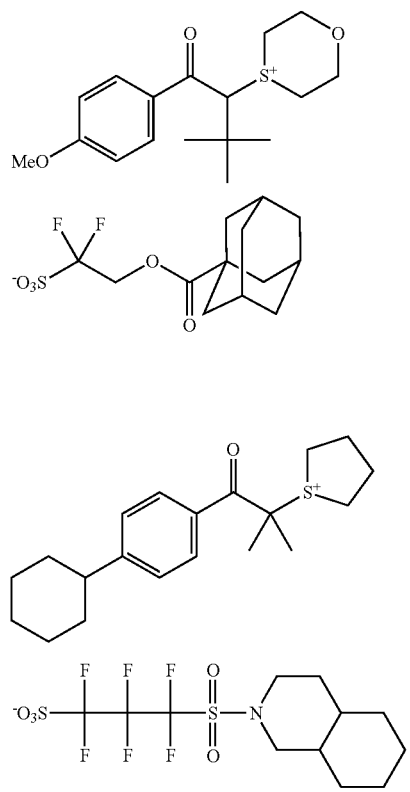
A-5
A-6
A-7
A-8
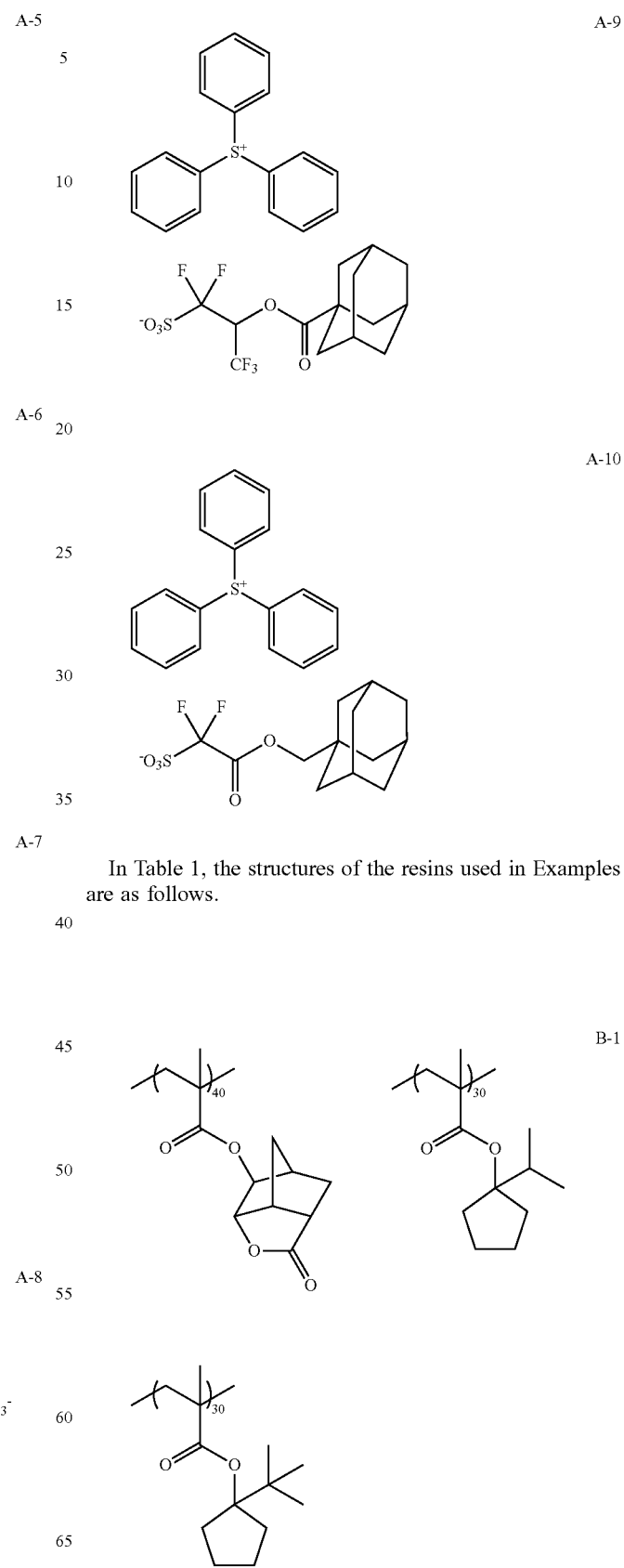
A-9
A-10
In Table 1, the structures of the resins used in Examples are as follows.
B-1

B-2
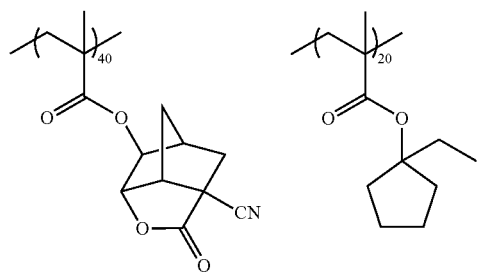
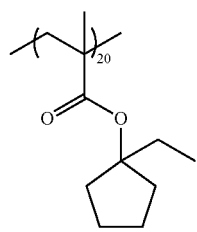
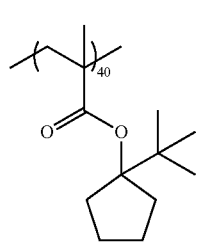
B-3
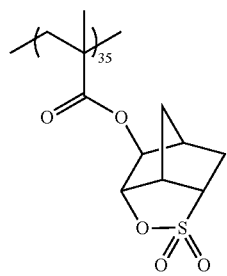
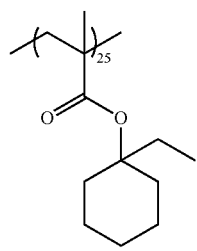
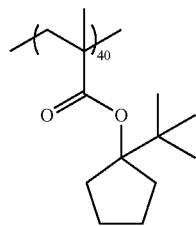
B-4
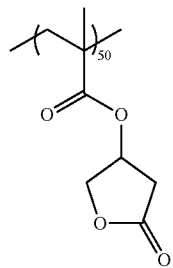
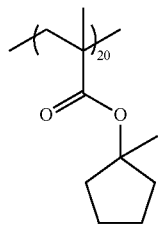
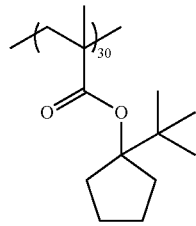
B-5
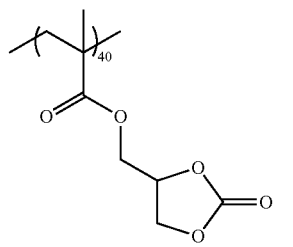
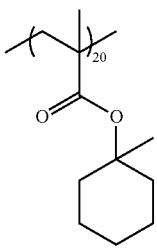
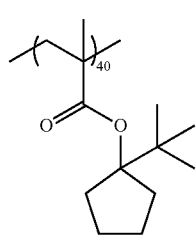
B-6
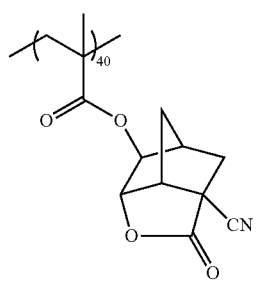
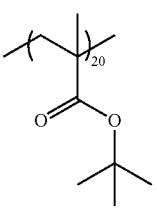
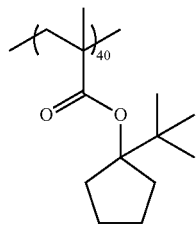
B-7
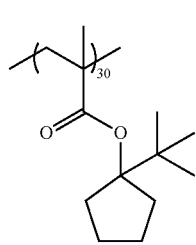
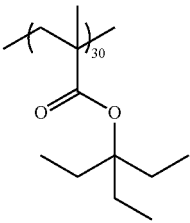

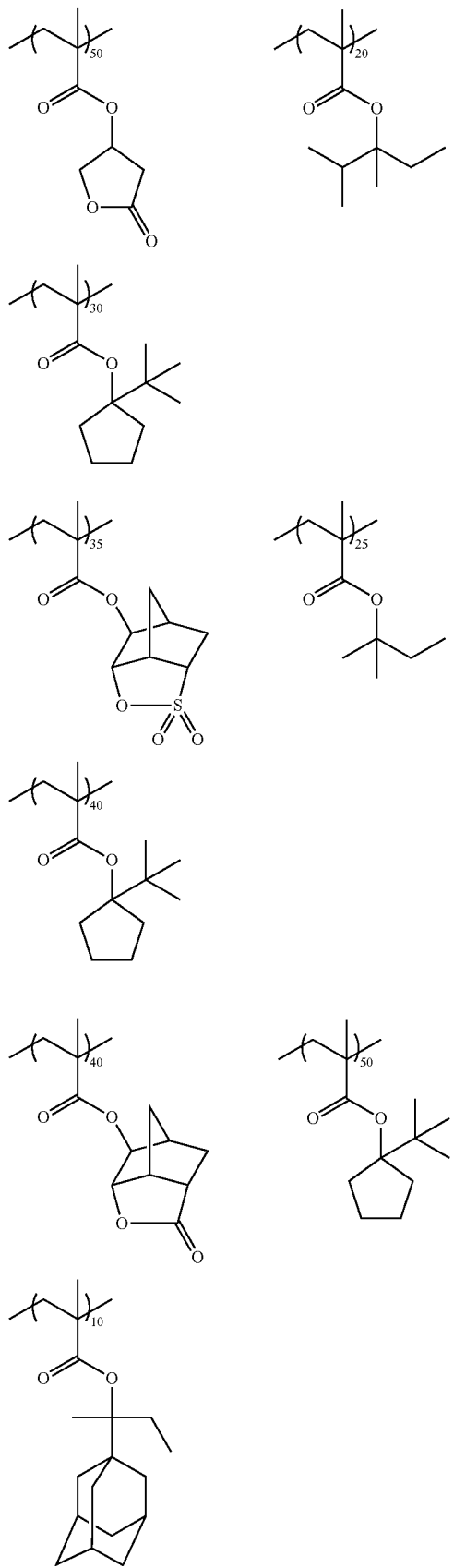
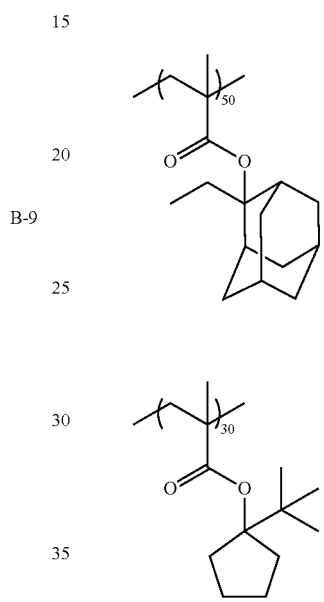
The compositional ratios of the repeating units are molar ratios. Further, the weight-average molecular weight (Mw) and the dispersity (Mw/Mn) are shown in Table 2 below. These were determined by the same method as that for the above-mentioned resin B-1.
TABLE 2
| Resin | Mw | Mw/Mn |
|---|---|---|
| B-1 | 9,000 | 1.65 |
| B-2 | 9,500 | 1.69 |
| B-3 | 10,000 | 1.59 |
| B-4 | 14,000 | 1.7 |
| B-5 | 12,000 | 1.65 |
| B-6 | 13,500 | 1.67 |
| B-7 | 9,500 | 1.57 |
| B-8 | 18,000 | 1.75 |
| B-9 | 8,000 | 1.62 |
| B-10 | 9,500 | 1.54 |
| B-11 | 7,800 | 1.64 |
| B-12 | 11,000 | 1.68 |
In Table 1, the structures of the resins used in Comparative Examples are as follows.

B-13
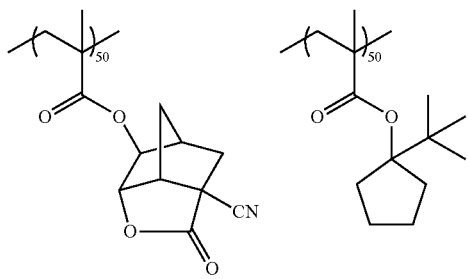
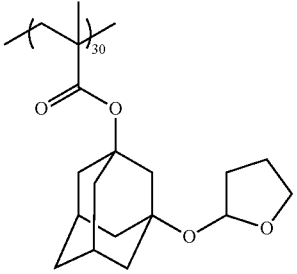
B-14
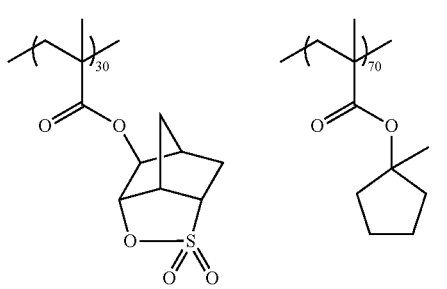
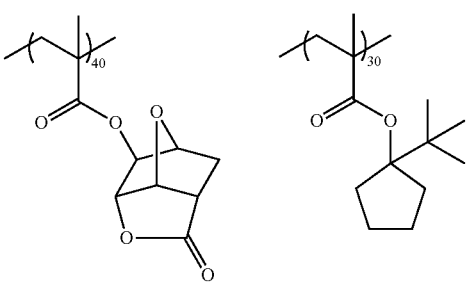
B-15
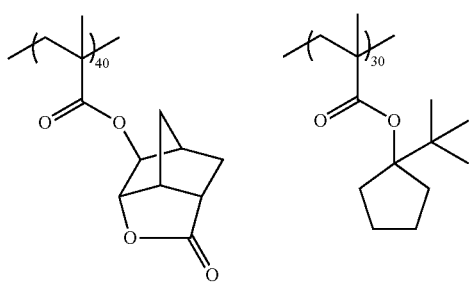
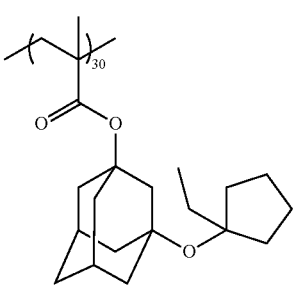
B-16
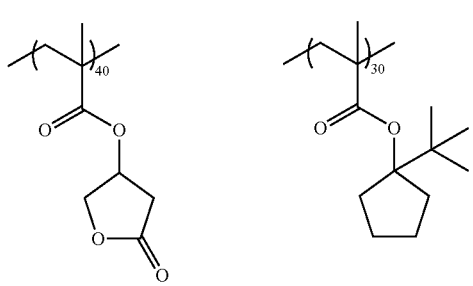
The compositional ratios of the repeating units are molar ratios. Further, the weight-average molecular weight (Mw) and the dispersity (Mw/Mn) are shown in Table 3 below. These were determined by the same method as that for the above-mentioned resin B-1.
TABLE 3
| Resin | Mw | Mw/Mn |
|---|---|---|
| B-13 | 10,000 | 1.58 |
| B-14 | 9,000 | 1.63 |
| B-15 | 9,500 | 1.75 |
| B-16 | 14,500 | 1.63 |
| B-17 | 16,000 | 1.79 |
In Table 1, the structures of the basic compounds are as follows.

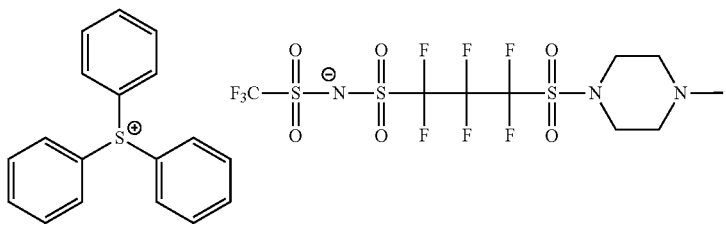
C-1
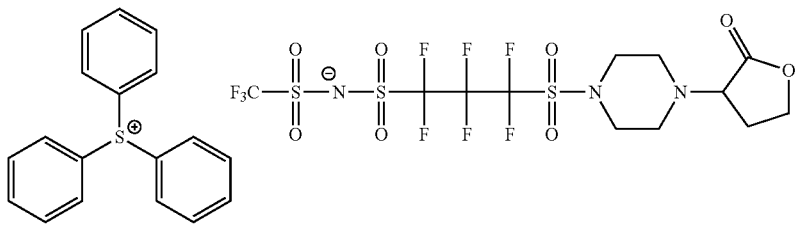
C-2
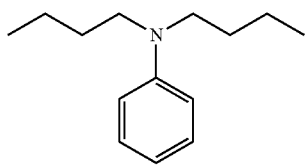
C-3
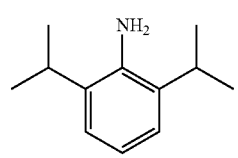
C-4
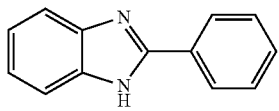
C-5
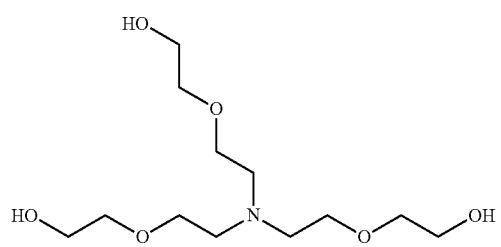
C-6
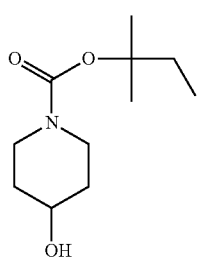
C-7
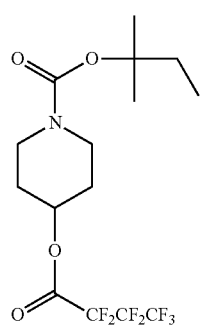
C-8
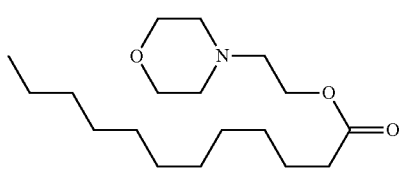
C-9

In Table 1, the structures of the hydrophobic resins are as follows.

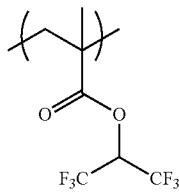
(1b)

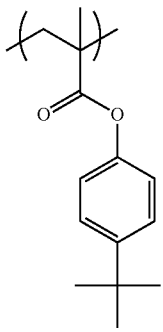

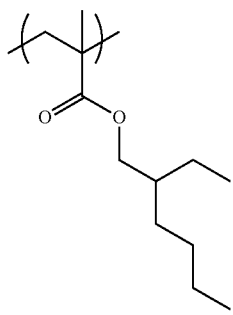
(2b)

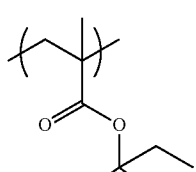

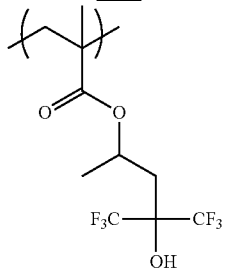

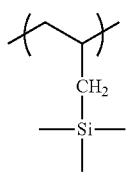
(3b)

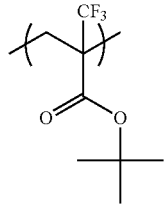

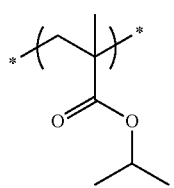
(4b)

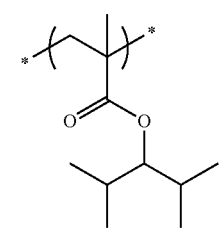

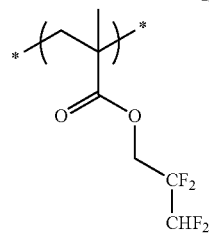
(5b)

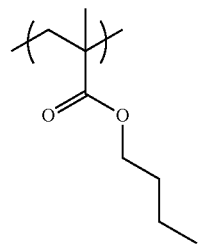

With respect to the respective hydrophobic resins, the compositional ratios (molar ratios; corresponding to the repeating units in order from the left side) of the respective repeating units, the weight-average molecular weight (Mw), and the dispersity (Mw/Mn) are shown in Table 4 below. These were determined by the same method as that for the above-mentioned resin B-1.

TABLE 4

| Resin | Compositional ratio (% by mole) | | | Mw | Mw/Mn |
|---|---|---|---|---|---|
| (1b) | 50 | 45 | 5 | 7,000 | 1.3 |
| (2b) | 40 | 40 | 20 | 18,600 | 1.57 |
| (3b) | 50 | 50 | — | 25,400 | 1.63 |
| (4b) | 30 | 65 | 5 | 28,000 | 1.7 |
| (5b) | 100 | — | — | 12,500 | 1.65 |

In Table 1, the solvents are as follows.
A1: Propylene glycol monomethyl ether acetate (PGMEA)
A2: Cyclohexanone
A3: γ-Butyrolactone
B1: Propylene glycol monomethyl ether (PGME)
B2: Ethyl lactate
In Table 1, the surfactants are as follows.
W-1: MEGAFACE F176 (manufactured by DIC, Inc.; fluorine-based)
W-2: MEGAFACE R08 (manufactured by DIC, Inc.; fluorine-based and silicon-based)

As seen from Table 1, as compared with Comparative Examples 1 to 5 in which the resin P was not contained, in Examples of the present application in which the resin P was contained, DOF was high and LWR was low.

In particular, in Examples 1 to 4 and 6 to 15 in which the total number of carbon atoms of $Rx_1$ to $Rx_3$ in General Formula (2) was 10 or less, LWR was lower.

Among these, in Examples 1, 2, 4, 6, and 8 to 12 in which the repeating unit represented by General Formula (2) was the repeating unit represented by General Formula (2-2), DOF was even higher and LWR was even lower.

From comparison among Examples 1 to 17, in Examples 1, 2, 4 to 6, and 8 to 12 in which the repeating unit represented by General Formula (2) was the repeating unit represented by General Formula (2-2) or (2-3), DOF was higher, and in particular, in Examples 1, 2, 4, 6, and 8 to 12 in which the repeating unit represented by General Formula (2) was the repeating unit represented by General Formula (2-2), DOF was even higher.

What is claimed is:

1. An active-light-sensitive or radiation-sensitive resin composition comprising:
   a resin P; and
   a compound that generates an acid upon irradiation with active light or radiation,
   wherein the resin P includes a repeating unit p1 represented by the following General Formula (1) and a repeating unit p22 represented by the following General Formula (2-2), and
   the repeating unit p22 does not have a group in which a hydroxy group of a hydroxyadamantyl group is protected with a group that decomposes by the action of an acid to leave,

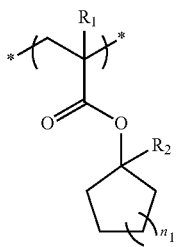
(1)

in General Formula (1), $R_1$ represents a hydrogen atom or an organic group, $R_2$ represents a tertiary alkyl group, $n_1$ represents a positive integer, and * represents a binding position, and

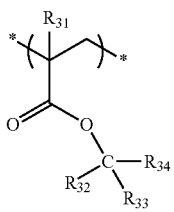
(2-2)

in General Formula (2-2), $R_{31}$ represents a hydrogen atom or an organic group, $R_{32}$, $R_{33}$, and $R_{34}$ each independently represents a linear or branched alkyl group, and * represents a binding position.

2. The active-light-sensitive or radiation-sensitive resin composition according to claim 1, wherein, in General Formula (2-2), the total number of carbon atoms of $R_{32}$, $R_{33}$ and $R_{34}$ is 10 or less.

3. The active-light-sensitive or radiation-sensitive resin composition according to claim 2, wherein, in General Formula (2-2), at least one of $R_{32}$, $R_{33}$, or $R_{34}$ is a linear or branched alkyl group having 2 or more carbon atoms.

4. The active-light-sensitive or radiation-sensitive resin composition according to claim 2, wherein, in General Formula (2-2), at least two of $R_{32}$, $R_{33}$, or $R_{34}$ are a linear or branched alkyl group having 2 or more carbon atoms.

5. The active-light-sensitive or radiation-sensitive resin composition according to claim 2, wherein, in General Formula (2-2), all of $R_{32}$, $R_{33}$, and $R_{34}$ are a linear or branched alkyl group having 2 or more carbon atoms.

6. The active-light-sensitive or radiation-sensitive resin composition according to claim 1, wherein, in General Formula (2-2), at least one of $R_{32}$, $R_{33}$, or $R_{34}$ is a linear or branched alkyl group having 2 or more carbon atoms.

7. The active-light-sensitive or radiation-sensitive resin composition according to claim 1, wherein, in General Formula (2-2), at least two of $R_{32}$, $R_{33}$, or $R_{34}$ are a linear or branched alkyl group having 2 or more carbon atoms.

8. The active-light-sensitive or radiation-sensitive resin composition according to claim 1, wherein, in General Formula (2-2), all of $R_{32}$, $R_{33}$, and $R_{34}$ are a linear or branched alkyl group having 2 or more carbon atoms.

9. A pattern forming method comprising at least:
   (i) a step of forming an active-light-sensitive or radiation-sensitive resin composition film on a substrate, using the active-light-sensitive or radiation-sensitive resin composition according to claim 1;
   (ii) a step of irradiating the film with active light or radiation; and
   (iii) a step of developing the film irradiated with active light or radiation using a developer.

10. The pattern forming method according to claim 9, wherein the developer is a developer including an organic solvent.

11. A method for manufacturing an electronic device, comprising:
    a step of preparing a substrate, wherein the substrate is an inorganic substrate,
    a coating type inorganic substrate, or
    a substrate used in a process for manufacturing a semiconductor, in a process for manufacture of a circuit board, or in lithographic processes of photofabrication; and
    a step of forming a pattern on the prepared substrate using the pattern forming method according to claim 9.

12. A pattern forming method comprising at least:
    (i) a step of forming an active-light-sensitive or radiation-sensitive resin composition film on a substrate, using the active-light-sensitive or radiation-sensitive resin composition according to claim 2;
    (ii) a step of irradiating the film with active light or radiation; and
    (iii) a step of developing the film irradiated with active light or radiation using a developer.

* * * * *